＃US009679827B2

United States Patent
Vishkin

(10) Patent No.: US 9,679,827 B2
(45) Date of Patent: Jun. 13, 2017

(54) 3D VLSI INTERCONNECTION NETWORK WITH MICROFLUIDIC COOLING, PHOTONICS AND PARALLEL PROCESSING ARCHITECTURE

(71) Applicant: Uzi Y. Vishkin, Potomac, MD (US)

(72) Inventor: Uzi Y. Vishkin, Potomac, MD (US)

(*) Notice: Subject to any disclaimer, the term of this patent is extended or adjusted under 35 U.S.C. 154(b) by 1 day.

(21) Appl. No.: 14/978,109

(22) Filed: Dec. 22, 2015

(65) Prior Publication Data

US 2016/0187580 A1   Jun. 30, 2016

Related U.S. Application Data

(60) Provisional application No. 62/096,539, filed on Dec. 24, 2014.

(51) Int. Cl.
*H01L 23/473* (2006.01)
*H01L 23/34* (2006.01)
*H01L 25/065* (2006.01)

(52) U.S. Cl.
CPC .......... *H01L 23/473* (2013.01); *H01L 23/345* (2013.01); *H01L 25/0657* (2013.01)

(58) Field of Classification Search
CPC .. H01L 23/473; H01L 25/0657; H01L 23/345
See application file for complete search history.

(56) References Cited

U.S. PATENT DOCUMENTS

| | | | |
|---|---|---|---|
| 7,834,440 B2* | 11/2010 | Ito ............................. | G11C 5/02 257/685 |
| 7,990,711 B1* | 8/2011 | Andry ................... | H01L 23/147 165/80.4 |
| 8,405,998 B2* | 3/2013 | Barowski ............ | H01L 23/3672 174/260 |
| 8,427,833 B2* | 4/2013 | Barowski .............. | H01L 23/481 257/691 |
| 9,439,330 B1* | 9/2016 | Wu ..................... | H05K 7/20772 |
| 2003/0081389 A1* | 5/2003 | Nair ....................... | H01L 25/16 361/764 |
| 2009/0308578 A1* | 12/2009 | Bernstein .............. | H01L 23/473 165/104.33 |
| 2012/0105145 A1* | 5/2012 | Barowski ............. | H01L 23/481 327/565 |

* cited by examiner

*Primary Examiner* — Alonzo Chambliss
(74) *Attorney, Agent, or Firm* — Nancy R. Gamburd; Gamburd Law Group LLC

(57) ABSTRACT

A three-dimensional VLSI integrated circuit apparatus is disclosed having a plurality of VLSI layers. A first VLSI layer includes a first silicon sublayer coupleable to at least one heat sink, and a first active silicon sublayer having a (first) plurality of photonic receivers (or transceivers); and a second VLSI layer including a second silicon sublayer having a first plurality of microfluidic cooling channels, and a second active silicon sublayer of the plurality of second VLSI sublayers having an interconnection network. Additional VLSI layers may also include a third VLSI layer having a third silicon sublayer having a second plurality of microfluidic cooling channels and a third active silicon sublayer having a (second) plurality of photonic transmitters (or transceivers). Additional VLSI layers may also include a third VLSI layer having microfluidic cooling channels and memory circuits, and a fourth VLSI layer having microfluidic cooling channels and parallel processing circuitry.

20 Claims, 7 Drawing Sheets

3D VLSI INTERCONNECTION NETWORK WITH MICROFLUIDIC COOLING, PHOTONICS AND PARALLEL PROCESSING ARCHITECTURE

CROSS-REFERENCE TO A RELATED APPLICATION

This application is a nonprovisional of and claims priority to and the benefit of U.S. Provisional Patent Application No. 62/096,539, filed Dec. 24, 2014, inventor Uzi Y. Vishkin, titled "Harness Enabling Technologies for Enhancing Data Movement in Computing Devices and Systems", the entire contents of which is incorporated herein by reference with the same full force and effect as if set forth in its entirety herein, and with priority claimed for all commonly disclosed subject matter.

FIELD OF THE INVENTION

The present invention relates, in general, to interconnection networks for data movement and, more particularly, to a three dimensional VLSI architecture having multiple layers with an interconnection network and a parallel processing circuit architectures with microfluidic cooling and photonic transceivers.

BACKGROUND OF THE INVENTION

In serial computing, communication was needed between the processor and memory. Starting around 2003 and into the foreseeable future most opportunities for performance growth in mainstream computers are based on their exploitation of the increasing number of processor cores. Communication must play an even bigger role to enable such exploitation since processors need to exchange information among them, and data need to be moved among the many processors and between processors and memory. The need for high-communication bandwidth is clear in some important applications (e.g., FFT). However, the need for communication is broader than that:

1. The current capacity of communication switches limit performance of large machines. They require connecting modules, boards, and/or racks and many of these connections would benefit from improved bandwidth and/or latency.
2. High-productivity parallel computer systems (i.e., a system that enable both fast application development time and fast runtime) would benefit greatly from a programmer's abstraction that assumes flat-memory; namely, that any set of concurrent memory requests can be satisfied in unit time. When memory addresses are known ahead of time, it is hard to estimate the latency of accessing them in modern computer systems, and effective support of the flat memory abstraction is helpful. However, such abstraction is even more desired in the many applications in which it is impossible to predict addresses of memory requests ahead of time (e.g., at compile time). Support of such abstraction has generally the added benefit that it includes high-bandwidth applications.

Bandwidth and latency of switches are often performance bottlenecks for large parallel computers. Zahavi et al 2014 points out the interest of switch vendors in reducing the number of chips in a switch, and the corollary that all the available ports in a chip should be used; greatly increasing the number of ports on a chip would improve the overall performance of the switch. E. Zahavi, I. Keslassy and A. Kolodny, "Quasi Fat Trees for HPC Clouds and Their Fault-Resilient Closed-Form Routing". Presented at Hot Interconnects (HOTI) 2014, Mountain View, Calif., USA.

Approaching the end of the so-called Dennard scaling is also an important concern as it implies decreasing improvement in power consumption of computers. This concern has led to a remarkable consensus in the industry and in the research community: communication avoidance must drive both the design of computer systems and their programming. Consequently, commercial parallel systems have been evolving away from a flat memory abstraction, for example without any multi-core (or GPU) machine in the market today that supports a flat memory abstraction; in particular, the impetus to avoid overheating of computer chips due to data movement ("DM") ended up leaving no choice for programmers but to labor hard in order to minimize such movement. Per the influential report [Fuller, Millet], which is a good representative of the aforementioned consensus, mainstream computer system vendors and researchers consign to even stricter restrictions on data movement in the future; their premise being that there is no way to avoid such restrictions for increasing parallelism (S. H. Fuller and L. I. Millet (editors). The Future of Computing Performance: Game Over or Next Level, National Research Council of the National Academies, National Academies Press, 2011). Vendors preferred to pack more and more functional units into a chip, due to their energy consumption relative to DM, resulting in increasingly unbalanced architectures.

The viewpoint article [Vishkin 2014] opines that claims that solutions requiring higher level of DM are not feasible (some use the term "dark silicon") played a key role in dashing some high hopes of vendors a decade ago, such as that: (1) Parallel computing in the form of multi-cores replaces serial computing for single-task general purpose applications, which did not materialize; and (2) machines of 500-1,000 cores will be widely deployed by 2014, which gave way to a reality of mostly cores in the single digit and two digits in the most advanced machines. [Vishkin 2014] elaborates on these dashed hopes tying the problem (both for multi-cores and GPUs) to the strict restrictions on DM, namely, the DM problem prevented flat-memory altogether and greatly constrained the number of cores in commercial machines. U. Vishkin, Is Multicore Hardware for General-Purpose Parallel Processing Broken?, *Comm. of the ACM* (*CACM*), Volume 57, No. 4, pages 35-39, April 2014.

A need remains, therefore, for a new integrated circuit architecture which enables and provides for significant data movement and a parallel processing architecture, while concurrently providing for a cooling architecture in a 3D VLSI structure and avoidance of the prior art overheating problems.

SUMMARY

Briefly, in one form, a representative embodiment comprises a three-dimensional VLSI integrated circuit apparatus, such as for data switching, comprising first, second and third VLSI layers. The first VLSI layer comprises: a first silicon sublayer coupleable to at least one heat sink; a first active silicon sublayer coupled to the first silicon sublayer, the first active silicon sublayer comprising a plurality of photonic receivers; and a first metal sublayer coupled to the first active silicon sublayer, the first metal sublayer comprising a first plurality of through-silicon vias. The second VLSI layer is coupled to the first VLSI layer, with the second VLSI layer comprising: a second silicon sublayer comprising a first plurality of microfluidic cooling channels; a second active silicon sublayer coupled to the second silicon sublayer, the second active silicon sublayer comprising an interconnection network; and a second metal sublayer coupled to the second active silicon sublayer, the second metal sublayer comprising a second plurality of through-silicon vias coupling the interconnection network to the plurality of photonic receivers through the first plurality of through-silicon vias. The third VLSI layer is coupled to the second VLSI layer, with the third VLSI layer comprising: a third silicon sublayer comprising a second plurality of microfluidic cooling channels; a third active silicon sublayer coupled to the third silicon sublayer, the third active silicon sublayer comprising a plurality of photonic transmitters; and a third metal sublayer coupled to the third active silicon sublayer, the third metal sublayer comprising a third plurality of through-silicon vias coupling the plurality of photonic transmitters to the interconnection network.

In a representative embodiment, the second plurality of through-silicon vias of the second metal sublayer of the second VLSI layer further couple the interconnection network to the plurality of photonic receivers through the first plurality of through-silicon vias and couple the interconnection network to the plurality of photonic transmitters through the third plurality of through-silicon vias.

In a representative embodiment, the three-dimensional VLSI integrated circuit apparatus comprises at least 100,000 photonic receivers and at least 100,000 photonic transmitters per 400 square millimeters of area.

Also in a representative embodiment, each microfluidic cooling channel of the first and second pluralities of microfluidic cooling channels is coupleable to a microfluidic pump and has a width between 75 microns and 125 microns and a height between 100 microns and 300 microns, and wherein the first, second, and third active silicon sublayers each have a thickness between 3 microns and 7 microns; and wherein the first VLSI layer further comprises a first silicon dioxide layer, the second VLSI layer further comprises a second silicon dioxide layer, the third VLSI layer further comprises a third silicon dioxide layer, and the fourth VLSI layer further comprises a fourth silicon dioxide layer, each silicon dioxide layer having a thickness between 3 microns and 7 microns.

In another representative embodiment, a three-dimensional VLSI integrated circuit apparatus comprises first and second VLSI layers, and optionally third and fourth VLSI layers. A first VLSI layer comprises: a first silicon sublayer coupleable to at least one heat sink; a first active silicon sublayer coupled to the first silicon sublayer, the first active silicon sublayer comprising a first plurality of photonic transceivers; and a first metal sublayer coupled to the first active silicon sublayer, the first metal sublayer comprising a first plurality of through-silicon vias. A second VLSI layer is coupled to the first VLSI layer, with the second VLSI layer comprising: a second silicon sublayer comprising a first plurality of microfluidic cooling channels; a second active silicon sublayer coupled to the second silicon sublayer, the second active silicon sublayer comprising an interconnection network; and a second metal sublayer coupled to the second active silicon sublayer, the second metal sublayer comprising a second plurality of through-silicon vias coupling the interconnection network to one or more photonic transceivers of first plurality of photonic transceivers through the first plurality of through-silicon vias.

In a representative embodiment, as an option, a third VLSI layer is coupled to the second VLSI layer, with the third VLSI layer comprising: a third silicon sublayer comprising a second plurality of microfluidic cooling channels; and a third active silicon sublayer coupled to the third silicon sublayer, the third active silicon sublayer comprising a second plurality of photonic transceivers. The third VLSI layer may further comprise: a third metal sublayer coupled to the third active silicon sublayer, the third metal sublayer comprising a third plurality of through-silicon vias coupling one or more photonic transceivers of the second plurality of photonic transceivers to the interconnection network. For example, the second plurality of through-silicon vias of the second metal sublayer of the second VLSI layer may further couple the interconnection network to the one or more photonic transceivers of first and second pluralities of photonic transceivers respectively through the first and third pluralities of through-silicon vias. In a representative embodiment, the first and second pluralities of microfluidic cooling channels are coupleable to a microfluidic pump.

In a representative embodiment, as an option, a third VLSI layer is coupled between the first and second VLSI layers, with the third VLSI layer comprising: a third silicon sublayer comprising a second plurality of microfluidic cooling channels; and a third active silicon sublayer coupled to the third silicon sublayer, the third active silicon sublayer comprising a plurality of memory circuits; and a third metal sublayer coupled to the third active silicon sublayer, the third metal sublayer comprising a third plurality of through-silicon vias coupling the plurality of memory circuits to the interconnection network. In a representative embodiment, the plurality of memory circuits further comprise a plurality of shared caches.

In a representative embodiment, as an option, a fourth VLSI layer coupled to the second VLSI layer, with the fourth VLSI layer comprising: a fourth silicon sublayer comprising a third plurality of microfluidic cooling channels; a fourth active silicon sublayer coupled to the fourth silicon sublayer, the fourth active silicon sublayer comprising a plurality of parallel processing circuits; and a fourth metal sublayer coupled to the fourth active silicon sublayer, the fourth metal sublayer comprising a fourth plurality of through-silicon vias coupling the plurality of parallel processing circuits to the interconnection network.

In a representative embodiment, each microfluidic cooling channel of the first, second and third pluralities of microfluidic cooling channels has a width between 75 microns and 125 microns and a height between 100 microns and 300 microns, and wherein the first, second, third and fourth active silicon sublayers each have a thickness between 3 microns and 7 microns. Also in a representative embodiment, the first VLSI layer further comprises a first silicon dioxide layer, the second VLSI layer further comprises a second silicon dioxide layer, the third VLSI layer further comprises a third silicon dioxide layer, and the fourth VLSI layer further comprises a fourth silicon dioxide layer, each silicon dioxide layer having a thickness between 3 microns and 7 microns.

In a representative embodiment, a plurality of arithmetic logic units of the plurality of parallel processing circuits have a first, combined data processing rate which substantially balances a second, data movement rate of the interconnection network. Also in a representative embodiment, the first, second, third and fourth pluralities of through-silicon vias further provide for data movement between and among the plurality of parallel processing circuits, the interconnection network, the plurality of memory circuits, and the plurality of photonic transceivers.

Another representative embodiment discloses a three-dimensional VLSI integrated circuit apparatus comprising first, second, third and fourth VLSI layers. A first VLSI layer comprising: a first silicon sublayer coupleable to at least one heat sink; a first active silicon sublayer coupled to the first silicon sublayer, the first active silicon sublayer comprising a plurality of parallel processing circuits; and a first metal sublayer coupled to the first active silicon sublayer, the first metal sublayer comprising a first plurality of through-silicon vias. A second VLSI layer is coupled to the first VLSI layer, with the second VLSI layer comprising: a second silicon sublayer comprising a first plurality of microfluidic cooling channels; a second active silicon coupled to the second silicon sublayer, the second active silicon sublayer comprising an interconnection network; and a second metal sublayer coupled to the second active silicon sublayer, the second metal sublayer comprising a second plurality of through-silicon vias coupling the interconnection network to the plurality of parallel processing circuits through the first plurality of through-silicon vias. A third VLSI layer is coupled to the second VLSI layer, with the third VLSI layer comprising: a third silicon sublayer comprising a second plurality of microfluidic cooling channels; a third active silicon sublayer coupled to the third silicon sublayer, the third active silicon sublayer comprising a plurality of memory circuits; and a third metal sublayer coupled to the third active silicon sublayer, the third metal sublayer comprising a third plurality of through-silicon vias coupling the plurality of memory circuits to the interconnection network though the second plurality of through-silicon vias. A fourth VLSI layer is coupled to the third VLSI layer, with the fourth VLSI layer comprising: a fourth silicon sublayer comprising a third plurality of microfluidic cooling channels; a fourth active silicon sublayer coupled to the fourth silicon sublayer, the fourth active silicon sublayer comprising a plurality of photonic transceivers; and a fourth metal sublayer coupled to the fourth active silicon sublayer, the fourth metal sublayer comprising a fourth plurality of through-silicon vias coupling the plurality of photonic transceivers to the plurality of memory circuits through the third plurality of through-silicon vias.

Typically, the first, second and third pluralities of microfluidic cooling channels are coupleable to a microfluidic pump. In a representative embodiment, each microfluidic cooling channel of the first, second and third pluralities of microfluidic cooling channels has a width between 75 microns and 125 microns and a height between 100 microns and 300 microns, and wherein the first, second, third and fourth active silicon sublayers each have a thickness between 3 microns and 7 microns.

Also in a representative embodiment, a plurality of arithmetic logic units of the plurality of parallel processing circuits have a first, combined data processing rate which substantially balances a second, data movement rate of the interconnection network. In a representative embodiment, the first, second, third and fourth pluralities of through-silicon vias further provide for data movement between and among the plurality of parallel processing circuits, the interconnection network, the plurality of memory circuits, and the plurality of photonic transceivers. Also in a representative embodiment, the plurality of memory circuits further comprise a plurality of shared caches; and the plurality of parallel processing circuits further comprise: at least one processor; at least one master thread control processor; and at least one spawn-join coprocessor.

Another representative embodiment discloses a three-dimensional VLSI integrated circuit apparatus comprising first, second, third and fourth VLSI layers. A first VLSI layer comprises: a first silicon sublayer coupleable to at least one heat sink; a first active silicon sublayer comprising a plurality of parallel processing circuits having a plurality of arithmetic logic units having a first, combined data processing rate; and a first metal sublayer coupled to the first active silicon sublayer, the first metal sublayer comprising a first plurality of through-silicon vias. A second VLSI layer is coupled to the first VLSI layer, with the second VLSI layer comprising: a second silicon sublayer comprising a first plurality of microfluidic cooling channels; a second active silicon sublayer coupled to the second silicon sublayer, the second active silicon sublayer comprising an interconnection network having a second, data movement rate substantially equal to the first, combined data processing rate; and a second metal sublayer comprising a second plurality of through-silicon vias coupling the interconnection network to the plurality of parallel processing circuits through the first plurality of through-silicon vias. A third VLSI layer is coupled to the second VLSI layer, with the third VLSI layer comprising: a third silicon sublayer comprising a second plurality of microfluidic cooling channels; a third active silicon sublayer coupled to the third silicon sublayer, the third active silicon sublayer comprising a plurality of memory circuits; and a third metal sublayer coupled to the third active silicon sublayer, the third metal sublayer comprising a third plurality of through-silicon vias coupling the plurality of memory circuits to the interconnection network though the second plurality of through-silicon vias. A fourth VLSI layer is coupled to the third VLSI layer, with the fourth VLSI layer comprising: a fourth silicon sublayer comprising a third plurality of microfluidic cooling channels; a fourth active silicon sublayer coupled to the fourth silicon sublayer, the fourth active silicon sublayer comprising a plurality of photonic transceivers; and a fourth metal sublayer coupled to the fourth active silicon sublayer, the fourth metal sublayer comprising a fourth plurality of through-silicon vias coupling the plurality of photonic transceivers to the plurality of memory circuits through the third plurality of through-silicon vias.

Another representative embodiment discloses a three-dimensional VLSI integrated circuit apparatus comprising first and second VLSI layers, and optionally third and fourth VLSI layers. A first VLSI layer comprises a plurality of first VLSI sublayers, a first silicon sublayer of the plurality of first VLSI sublayers coupleable to at least one heat sink, and a first active silicon sublayer of the plurality of first VLSI sublayers comprising a first plurality of photonic transceivers. A second VLSI layer is coupled to the first VLSI layer, with the second VLSI layer comprising a plurality of second VLSI sublayers, a second silicon sublayer of the plurality of second VLSI sublayers comprising a first plurality of microfluidic cooling channels, and a second active silicon sublayer of the plurality of second VLSI sublayers comprising an interconnection network. In a representative embodiment, the first VLSI layer further comprises: a first metal sublayer of the plurality of first VLSI sublayers, the first metal sublayer comprising a first plurality of through-silicon vias coupling one or more photonic transceivers of the first plurality of photonic transceivers to the interconnection network.

Also in a representative embodiment, a third VLSI layer may be coupled to the second VLSI layer, with the third VLSI layer comprising: a plurality of third VLSI sublayers, a third silicon sublayer of the plurality of third VLSI sublayers comprising a second plurality of microfluidic cooling channels, and a third active silicon sublayer of the plurality of third VLSI sublayers comprising a second plurality of photonic transceivers. In a representative embodiment, the second VLSI layer further comprises: a second metal sublayer of the plurality of second VLSI sublayers, the second metal sublayer comprising a second plurality of through-silicon vias coupling the interconnection network to one or more photonic transceivers of first and second pluralities of photonic transceivers. Also in a representative embodiment, the third VLSI layer further comprises: a third metal sublayer of the plurality of third VLSI sublayers, the third metal sublayer comprising a third plurality of through-silicon vias coupling one or more photonic transceivers of the second plurality of photonic transceivers to the interconnection network.

Another representative embodiment discloses a three-dimensional VLSI integrated circuit apparatus comprising first, second, third and optionally fourth VLSI layers. A first VLSI layer comprises: a plurality of first VLSI sublayers, a first silicon sublayer of the plurality of first VLSI sublayers coupleable to at least one heat sink, and a first active silicon sublayer of the plurality of first VLSI sublayers comprising a plurality of parallel processing circuits. A second VLSI layer is coupled to the first VLSI layer, with the second VLSI layer comprising: a plurality of second VLSI sublayers, a second silicon sublayer of the plurality of second VLSI sublayers comprising a first plurality of microfluidic cooling channels, and a second active silicon sublayer of the plurality of second VLSI sublayers comprising an interconnection network. A third VLSI layer is coupled to the second VLSI layer, with the third VLSI layer comprising: a plurality of third VLSI sublayers, a third silicon sublayer of the plurality of third VLSI sublayers comprising a second plurality of microfluidic cooling channels, and a third active silicon sublayer of the plurality of third VLSI sublayers comprising a plurality of memory circuits.

In a representative embodiment, the first VLSI layer further comprises: a first metal sublayer of the plurality of first VLSI sublayers, the first metal sublayer comprising a first plurality of through-silicon vias coupling the plurality of parallel processing circuits to the interconnection network. Also in a representative embodiment, the second VLSI layer further comprises: a second metal sublayer of the plurality of second VLSI sublayers, the second metal sublayer comprising a second plurality of through-silicon vias coupling the interconnection network to the plurality of memory circuits.

In a representative embodiment, a fourth VLSI layer is coupled to the third VLSI layer, with the fourth VLSI layer comprising: a plurality of fourth VLSI sublayers, a fourth silicon sublayer of the plurality of fourth VLSI sublayers comprising a third plurality of microfluidic cooling channels, and a fourth active silicon sublayer of the plurality of third VLSI sublayers comprising a plurality of photonic transceivers. Also in a representative embodiment, the third VLSI layer further comprises: a third metal sublayer of the plurality of third VLSI sublayers, the third metal sublayer comprising a third plurality of through-silicon vias coupling the interconnection network to the plurality of photonic transceivers.

Another representative embodiment discloses a three-dimensional VLSI integrated circuit apparatus comprising first, second, third and optionally fourth VLSI layers. A first VLSI layer comprises a plurality of first VLSI sublayers, a first silicon sublayer of the plurality of first VLSI sublayers coupleable to at least one heat sink, a first active silicon sublayer of the plurality of first VLSI sublayers comprising a first plurality of photonic transceivers, and a first metal sublayer of the plurality of first VLSI sublayers, the first metal sublayer comprising a first plurality of through-silicon vias. A second VLSI layer is coupled to the first VLSI layer, with the second VLSI layer comprising: a plurality of second VLSI sublayers, a second silicon sublayer of the plurality of second VLSI sublayers comprising a first plurality of microfluidic cooling channels, a second active silicon sublayer of the plurality of second VLSI sublayers comprising an interconnection network, and a second metal sublayer of the plurality of second VLSI sublayers, the second metal sublayer comprising a second plurality of through-silicon vias coupling the interconnection network to one or more photonic transceivers of the first plurality of photonic transceivers. A third VLSI layer is coupled to the second VLSI layer, with the third VLSI layer comprising a plurality of third VLSI sublayers, a third silicon sublayer of the plurality of third VLSI sublayers comprising a second plurality of microfluidic cooling channels, a third active silicon sublayer of the plurality of third VLSI sublayers comprising a second plurality of photonic transceivers, and a third metal sublayer of the plurality of third VLSI sublayers, the third metal sublayer comprising a third plurality of through-silicon vias coupling the second plurality of photonic transceivers to the interconnection network.

Another representative embodiment discloses a three-dimensional VLSI integrated circuit apparatus comprising first, second, third and fourth VLSI layers. A first VLSI layer comprises: a plurality of first VLSI sublayers, a first silicon sublayer of the plurality of first VLSI sublayers coupleable to at least one heat sink, and a first active silicon sublayer of the plurality of first VLSI sublayers comprising a first plurality of photonic transceivers. A second VLSI layer is coupled to the first VLSI layer, with the second VLSI layer comprising: a plurality of second VLSI sublayers, a second silicon sublayer of the plurality of third VLSI sublayers comprising a first plurality of microfluidic cooling channels, and a second active silicon sublayer of the plurality of second VLSI sublayers comprising a plurality of memory circuits. A third VLSI layer is coupled to the second VLSI layer, with the third VLSI layer comprising a plurality of third VLSI sublayers, a third silicon sublayer of the plurality of second VLSI sublayers comprising a second plurality of microfluidic cooling channels, and a third active silicon sublayer of the plurality of third VLSI sublayers comprising an interconnection network. A fourth VLSI layer is coupled to the third VLSI layer, with the fourth VLSI layer comprising: a plurality of fourth VLSI sublayers, a fourth silicon sublayer of the plurality of fourth VLSI sublayers comprising a third plurality of microfluidic cooling channels, and a fourth active silicon sublayer of the plurality of third VLSI sublayers comprising a plurality of parallel processing circuits.

Numerous other advantages and features of the present invention will become readily apparent from the following detailed description of the invention and the embodiments thereof, from the claims and from the accompanying drawings.

BRIEF DESCRIPTIONS OF THE DRAWINGS

The objects, features and advantages of the present invention will be more readily appreciated upon reference to the following disclosure when considered in conjunction with the accompanying drawings, wherein like reference numerals are used to identify identical components in the various views, and wherein reference numerals with alphabetic characters are utilized to identify additional types, instantiations or variations of a selected component embodiment in the various views, in which.

DETAILED DESCRIPTION OF REPRESENTATIVE EMBODIMENTS

Figure 1:
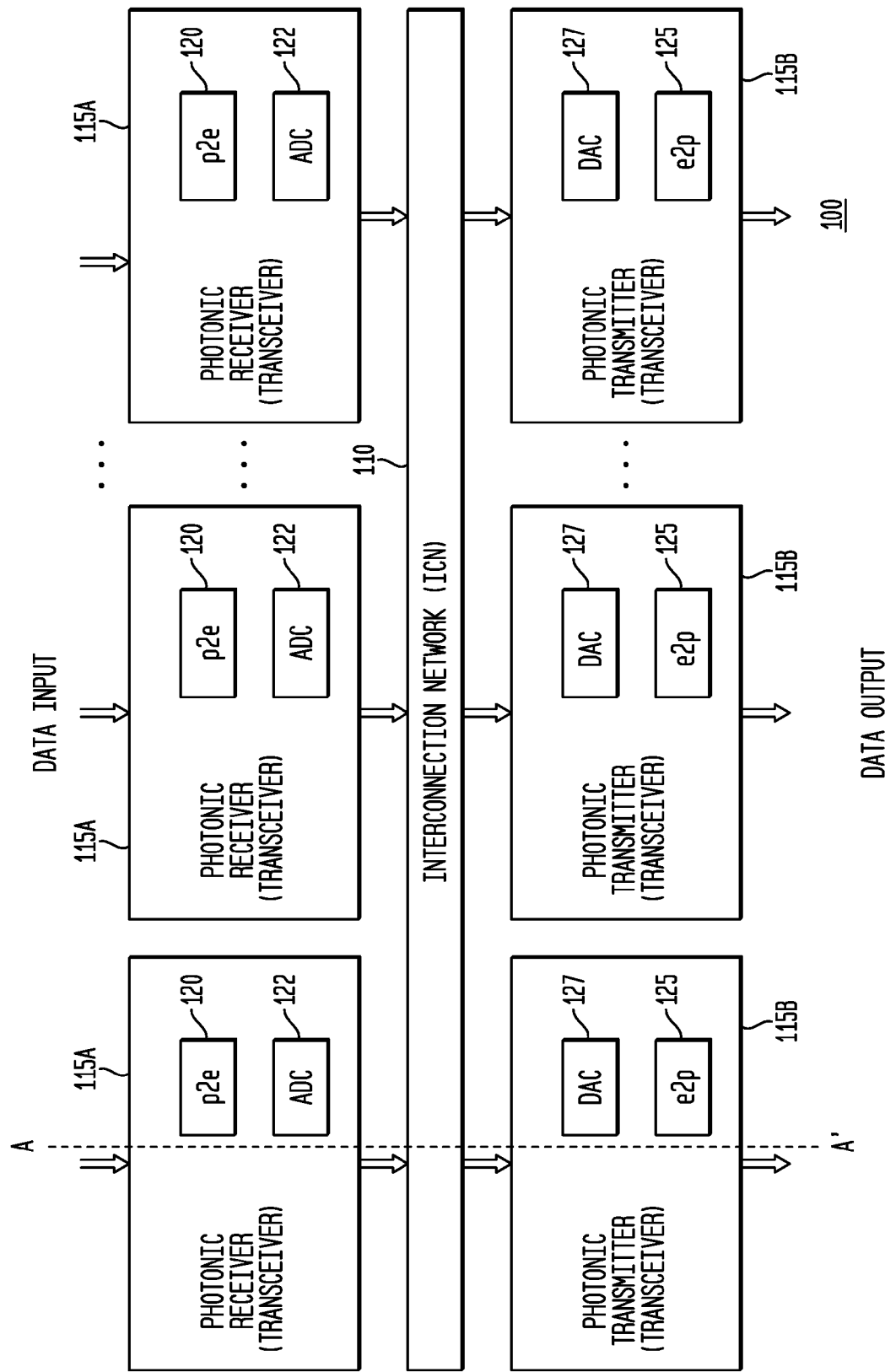
FIG. 1 is a block diagram of an interconnection network with photonic transceivers of a first exemplary embodiment of a 3D VLSI data switching apparatus having microfluidic cooling.

While the present invention is susceptible of embodiment in many different forms, there are shown in the drawings and will be described herein in detail specific exemplary embodiments thereof, with the understanding that the present disclosure is to be considered as an exemplification of the principles of the invention and is not intended to limit the invention to the specific embodiments illustrated. In this respect, before explaining at least one embodiment consistent with the present invention in detail, it is to be understood that the invention is not limited in its application to the details of construction and to the arrangements of components set forth above and below, illustrated in the drawings, or as described in the examples. Methods and apparatuses consistent with the present invention are capable of other embodiments and of being practiced and carried out in various ways. Also, it is to be understood that the phraseology and terminology employed herein, as well as the abstract included below, are for the purposes of description and should not be regarded as limiting.

Figure 2:
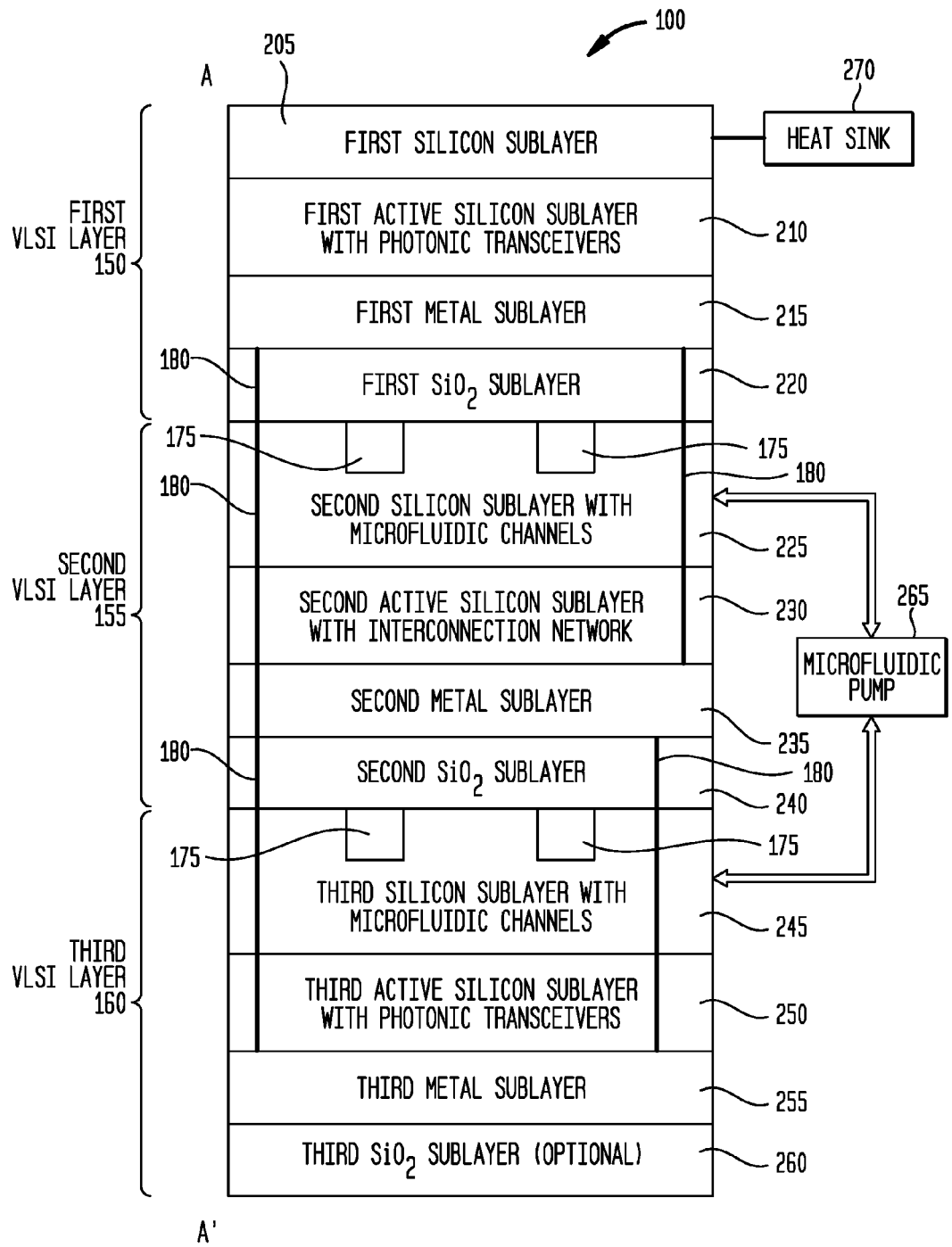
FIG. 2 is a cross sectional view of the interconnection network with photonic transceivers of FIG. 1 and illustrating of a plurality of VLSI circuit layers with microfluidic cooling in the first exemplary embodiment of a 3D VLSI data switching apparatus.
Figure 3:
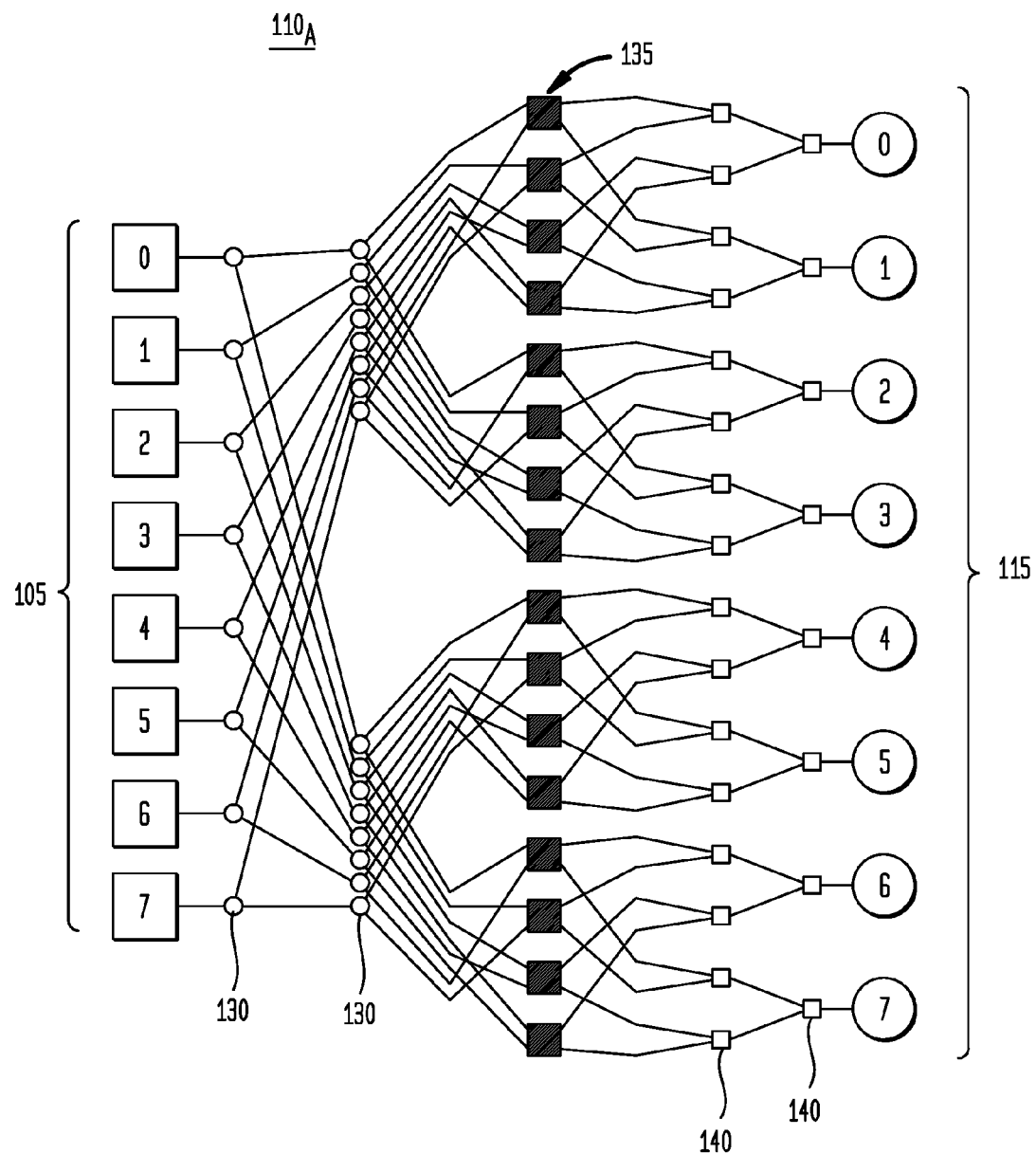
FIG. 3 is a block diagram of a first hybrid interconnection network.
Figure 4:
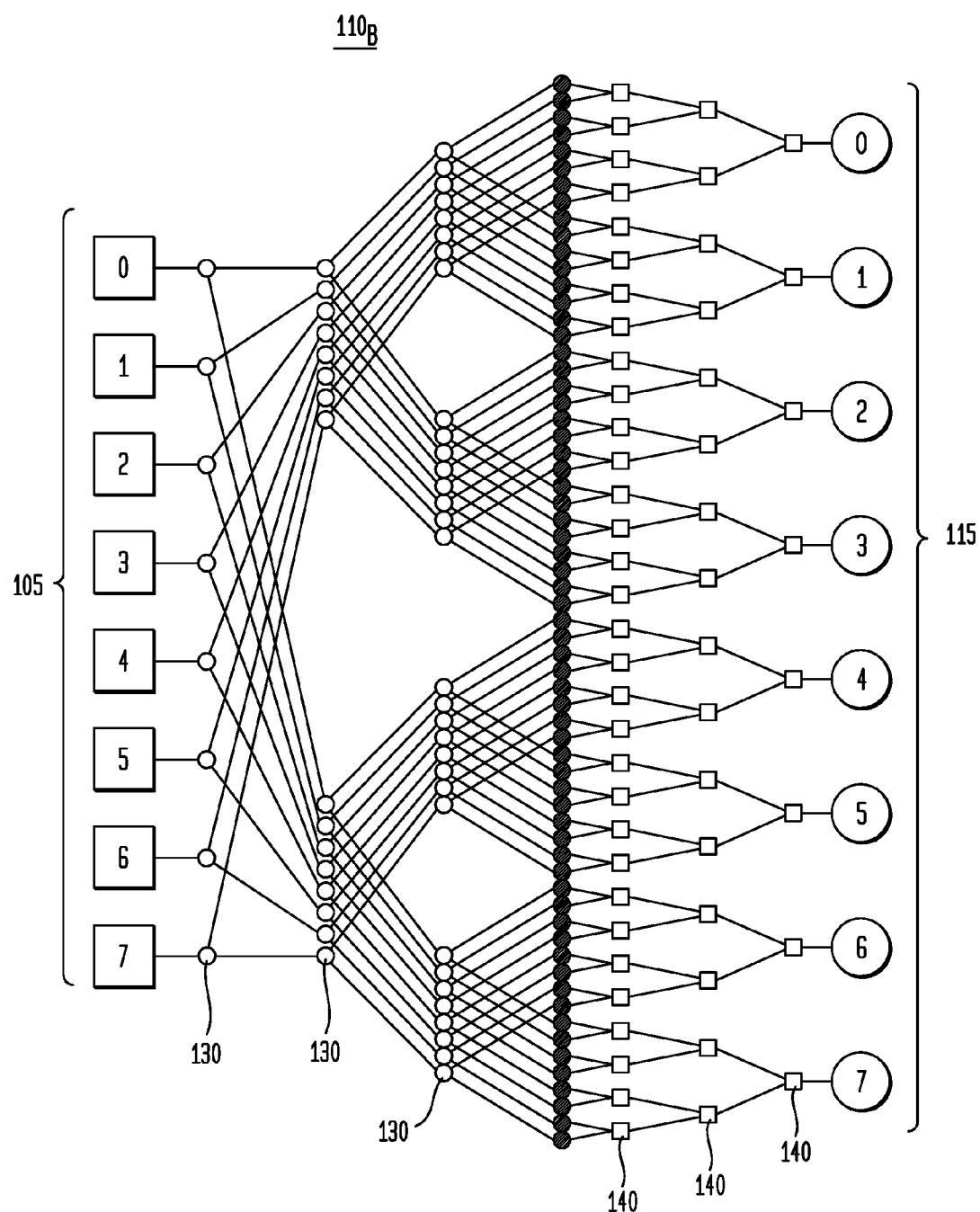
FIG. 4 is a block diagram of a second interconnection network.
Figure 5:
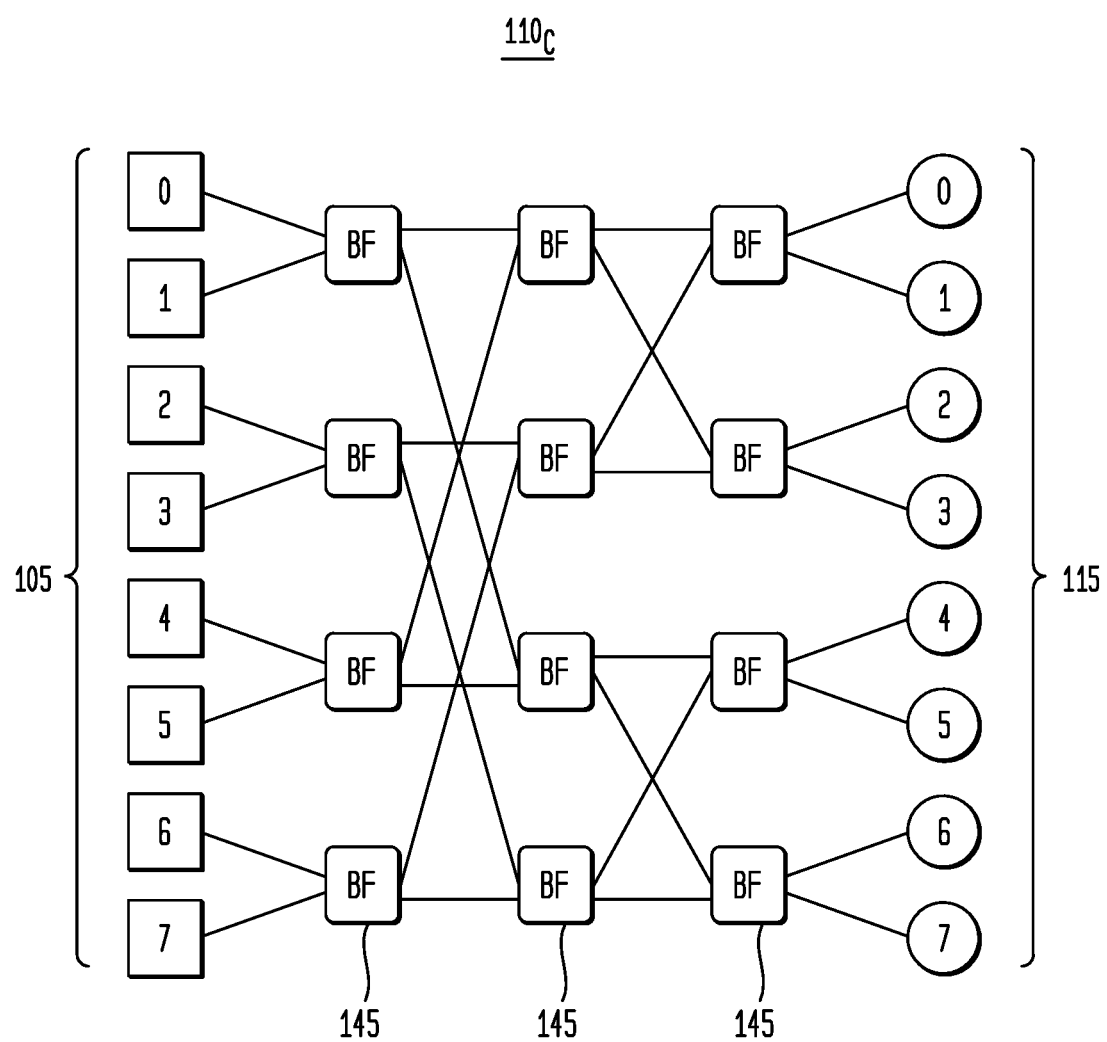
FIG. 5 is a block diagram of a third interconnection network.

FIG. 1 is a block diagram of an interconnection network 110 with photonic transceivers 115 of a first exemplary embodiment of a 3D VLSI (Very Large Scale Integration) data switching apparatus 100 having microfluidic cooling. FIG. 2 is a cross sectional view (through the A-A' plane of FIG. 1) of the interconnection network 110 with photonic transceivers 115 of FIG. 1 and illustrating of a plurality of VLSI circuit layers with microfluidic cooling channels 175 in the first exemplary embodiment of a 3D VLSI data switching apparatus 100. FIG. 3 is a block diagram of a first hybrid interconnection network 110A. FIG. 4 is a block diagram of a second mesh of trees interconnection network 110 B. FIG. 5 is a block diagram of a third butterfly interconnection network 110C.

The 3D VLSI data switching apparatus 100 provides a switch for a high performance computer, for example, as a large switch with many ports and an interconnection network 110 among ports by integrating 3D-VLSI, microfluidic hotspot cooling and photonics.

The main ingredients in present approach are: silicon-compatible photonics, microfluidic hotspot cooling and 3D-VLSI. Put together, these ingredients will eliminate overheating, provide stronger switches, and when combined with the right parallel computer architecture would incorporate a "flat memory abstraction". Photonics provides clear advantages for low-power high-bandwidth inter-chip communication, while electronics remains advantageous for switching and intra-chip communication. Currently, high power dissipation limits scaling of inter-chip communication and intra-chip communication and switching due to residual heating effects. The present solution integrates these devices with microfluidic cooling in 3D-VLSI chips, enabling major scale-up and orders of magnitude improvement in heat management.

In addition, the 3D VLSI parallel processing and data switching apparatus 300 discussed below, which also includes significant components and 3D VLSI layers of the 3D VLSI data switching apparatus 100, enables the continued use of the flat memory abstraction utilized in computer programming, in which any memory may be accessed at any time by any processor. More specifically, the unique combination of photonics with an interconnection network, with microfluidic cooling, enables a significantly high rate of data movement which generally matches or balances the significantly high combined data processing rate of many arithmetic logic units of a plurality of parallel processing circuits, eliminating the prior art data movement bottleneck. In addition, as discussed in greater detail below, a plurality of through-silicon vias, through all of these different 3D VLSI layers, enables such significant data movement between and among the plurality of parallel processing circuits, the interconnection network, the plurality of memory circuits, and the plurality of photonic transceivers, all in different 3D VLSI layers.

Referring to FIGS. 1 and 2, the exemplary 3D VLSI data switching apparatus 100 comprises an interconnection network 110 with a plurality of photonic transceivers 115, which in this embodiment are separated into photonic receivers 115A and photonic transmitters 115B (it being understood that combining them will result in transceivers, and so are referred to herein more generally as "transceivers", it being further understood that photonic transceivers 115 may have either or both transmitting and receiving functionality), illustrated as a (first) plurality of photonic receivers (or photonic transceivers) 115A for data input and a (second) plurality of photonic transmitters (or photonic transceivers) 115B for data output. Included within the plurality of photonic receivers 115A are a plurality of photonic-electronic converters 120 and a plurality of analog-to-digital converters 122, and included within the plurality of photonic receivers 115A are a plurality of electronic-photonic converters 125 and a plurality of digital-to-analog converters 127. The plurality of photonic receivers (or photonic transceivers) 115A provide for data input into the interconnection network 110, converting analog photonic or optically-transmitted information (e.g., initially from a fiber optic network) into digital electronic or electrical information ("p2e") suitable for routing and switching within the interconnection network 110. The plurality of photonic transmitters (or photonic transceivers) 115B provide for data output from the interconnection network 110, converting digital electronic or electrical information into analog photonic or optically-transmitted information ("e2p") suitable for transmission over a fiber optic network, for example and without limitation. It should be noted that while referred to as analog photonic information, those having skill in the art will recognize that it may be digitally encoded and transmitted or received in a particular frequency or wavelength band. Those having skill in the art will also recognize that additional components (not separately illustrated) may be utilized, both on-chip and off-chip, for coupling the 3D VLSI data switching apparatus 100 to a fiber optic network for full duplex, bidirectional information transmission and reception, including other analog-to-digital converters, digital-to-analog converters, wavelength division multiplexers and demultiplexers, grating, short wire bonds, etc., as may be known in the art (see, e.g., Dupuis et al.: 30-GB/S Optical Link Combining Heterogeneously Integrated III-V/SI Photonics With 32-NM CMOS Circuits, Journal of Lightwave Technology, Vol. 33, No. 3, Feb. 1, 2015, pp. 657-661, incorporated herein by reference with the same full force and effect as if set forth in its entirety herein). An advantage of this design of FIGS. 1 and 2 is that data switching is unidirectional, with data input at the top of the 3D VLSI data switching apparatus 100 as output at the bottom of the 3D VLSI data switching apparatus 100.

Various types of interconnection networks 110 suitable for use in the 3D VLSI data switching apparatus 100 (and also in the 3D VLSI parallel processing and data switching apparatus 300) are illustrated in FIGS. 3-5, such as a first hybrid interconnection network $110_A$, a second mesh of trees interconnection network $110_B$, and a third butterfly interconnection network $110_C$, all having eight data input nodes 105 and eight data output nodes 115 (or vice-versa). The interconnection networks $110_A$, $110_B$ and $110_C$ all provide that data input on any $i^{th}$ input node 105 (on the left) can be switched to any $j^{th}$ output node 115 (on the right). The hybrid interconnection network $110_A$ includes a plurality of one by two (1×2) switches 130 (typically implemented using a plurality of transistors and/or buffer circuits), a plurality of two by two (2×2) switches 135 (also typically implemented using a plurality of transistors and/or buffer circuits), and a plurality of two by one (2×1) switches 140 (also typically implemented using a plurality of transistors and/or buffer circuits), as illustrated. The mesh of trees interconnection network $110_B$ includes a plurality of one by two (1×2) switches 130 (typically implemented using a plurality of transistors and/or buffer circuits) and a plurality of two by one (2×1) switches 140 (also typically implemented using a plurality of transistors and/or buffer circuits), as illustrated. The butterfly interconnection network $110_C$ includes a plurality of two by two (2×2) butterfly switches 145 (typically implemented using a plurality of transistors and/or buffer circuits), as illustrated, and typically utilized for fast Fourier transform (FFT) calculations.

Referring to FIG. 2, the representative or exemplary 3D VLSI data switching apparatus 100 comprises a plurality of different VLSI layers, namely, a first VLSI layer 150, a second VLSI layer 155, and a third VLSI layer 160, each of which comprises a plurality of VLSI sublayers in a selected order to provide for both through-silicon via (TSV) 180 metal interconnections between the plurality of VLSI layers 150, 155 and 160, but also microfluidic cooling through microfluidic cooling channels 175 between the plurality of VLSI layers 150, 155 and 160 and in comparatively close proximity to the active silicon sublayers 230, 250, and optionally 210. Each of these sublayers generally has a width and length (x-axis and y-axis) which are coextensive with the entire width and length of the VLSI layers and the 3D VLSI data switching apparatus 100, and have varying thicknesses (z-axis), as described below.

The first VLSI layer 150 includes a first silicon sublayer 205 which has a thickness generally between 500 microns and 1500 microns, or more particularly between 700 microns and 1300 microns, or more particularly between 900 microns and 1100 microns, or more particularly between 950 microns and 1050 microns, or more particularly on the order of about 995 microns in thickness. The first silicon sublayer 205 is typically coupled to a heat sink 270 for cooling as illustrated, but which may also include microfluidic cooling channels 175 (not separately illustrated). Next to or adjacent the first silicon sublayer 205 is a first active silicon sublayer 210, which has a thickness generally between 2 microns and 8 microns, or more particularly between 3 microns and 7 microns, or more particularly between 4 microns and 6 microns, or more particularly on the order of about 5 microns in thickness. The first active silicon sublayer 210 includes the plurality of photonic receivers (or photonic transceivers) 115A and any other related circuitry mentioned above. The first active silicon sublayer 210 is typically cooled through the first silicon sublayer 205 coupled to the heat sink 270 (or having microfluidic cooling channels 175, as described below).

Next to or adjacent the first active silicon sublayer 210 is a first metal sublayer 215 which has a thickness generally between 2 microns and 8 microns, or more particularly between 3 microns and 7 microns, or more particularly between 4 microns and 6 microns, or more particularly on the order of about 5 microns in thickness. The first metal sublayer 215 provides and includes wire interconnections (between and among the transistors, buffers, etc. forming the plurality of photonic receivers (or photonic transceivers) 115A), external connections (as an option in addition to photonic external connections, such as power, ground, and clocking), and also providing metal though-silicon via (TSV) 180 connections between adjacent VLSI layers (in this case, between first and second VLSI layers 150 and 155, such as to couple the plurality of photonic receivers (or photonic transceivers) 115A to the interconnection network 110 discussed below, through the though-silicon vias (TSV) 180 of both the first and second VLSI layers 150, 155). Next to or adjacent the first metal sublayer 215 is a first silicon dioxide sublayer 220 which has a thickness generally between 2 microns and 8 microns, or more particularly between 3 microns and 7 microns, or more particularly between 4 microns and 6 microns, or more particularly on the order of about 5 microns in thickness.

The second VLSI layer 155 is coupled to the first silicon dioxide sublayer 220 of the first VLSI layer 150. The second VLSI layer 155 includes a second silicon sublayer 225 which includes a plurality of microfluidic cooling channels 175. The second silicon sublayer 225 has a thickness sufficient to provide for the diameter (or height and width) of the microfluidic cooling channels 175; the thickness of the second silicon sublayer 225 is generally between 150 microns and 350 microns, or more particularly between 200 microns and 300 microns, or more particularly between 225 microns and 275 microns, or more particularly on the order of about 255 microns in thickness, which second silicon sublayer 225 in turn includes a plurality of microfluidic cooling channels 175. Each microfluidic cooling channel 175 has a thickness (diameter or height) generally between 100 microns and 300 microns, or more particularly between 125 microns and 275 microns, or more particularly between 150 microns and 250 microns, or more particularly between 175 microns and 225 microns, or more particularly on the order of about 200 microns in thickness, and may have any selected width generally on the order of between 25 microns to 300 microns, or more particularly between 50 microns and 250 microns, or more particularly between 75 microns and 125 microns, or more particularly between 90 microns and 110 microns, or more particularly on the order of about 100 microns in width, and a length which generally spans the length (or much of the length) of the 3D VLSI data switching apparatus 100. The microfluidic cooling channels 175 are coupled to a microfluidic pump 265, and typically a suitable fluid (such as filtered cold water, e.g., filtered tap water) is pumped through the microfluidic cooling channels 175 for heat transfer, with or without any return path for cooling and water reuse of the warmed fluid. As another alternative, the microfluidic cooling channels 175 may also be coupled to each other at one end of the device to provide a round trip a fluid return path, not separately illustrated, or may have such a return path coupled externally to the pump 265.

Next to or adjacent the second silicon sublayer 225 is a second active silicon sublayer 230 which has a thickness generally between 2 microns and 8 microns, or more particularly between 3 microns and 7 microns, or more particularly between 4 microns and 6 microns, or more particularly on the order of about 5 microns in thickness. The second active silicon sublayer 230 includes the interconnection network 110, and provides a close coupling of the microfluidic cooling channels 175 to the heat-generating interconnection network 110, thereby allowing significantly improved switching and data transmission rates without harming the 3D VLSI data switching apparatus 100. Next to or adjacent the second active silicon sublayer 230 is a second metal sublayer 235 which has a thickness generally between 2 microns and 8 microns, or more particularly between 3 microns and 7 microns, or more particularly between 4 microns and 6 microns, or more particularly on the order of about 5 microns in thickness. The second metal sublayer 235 provides and includes wire interconnections (between and among the transistors, buffers, etc. forming the interconnection network 110) and also providing metal though-silicon via (TSV) 180 connections between adjacent VLSI layers (in this case, between first, second and third VLSI layers 150, 155 and 160, such as coupling the interconnection network 110 to the plurality of photonic receivers (or photonic transceivers) 115A and to the plurality of photonic transmitters (or photonic transceivers) 115B through the though-silicon vias (TSV) 180 of the first, second and third VLSI layers 150, 155, 160). Next to or adjacent the second metal sublayer 235 is a second silicon dioxide sublayer 240, also which has a thickness generally between 2 microns and 8 microns, or more particularly between 3 microns and 7 microns, or more particularly between 4 microns and 6 microns, or more particularly on the order of about 5 microns in thickness.

The third VLSI layer 160 is coupled to the second silicon dioxide sublayer 240 of the second VLSI layer 155. The third VLSI layer 160 includes a third silicon sublayer 245 which includes a plurality of microfluidic cooling channels 175. The third silicon sublayer 245 has a thickness sufficient to provide for the diameter (or height and width) of the microfluidic cooling channels 175; the thickness of the third silicon sublayer 245 is generally between 150 microns and 350 microns, or more particularly between 200 microns and 300 microns, or more particularly between 225 microns and 275 microns, or more particularly on the order of about 255 microns in thickness, which third silicon sublayer 245 in turn includes a plurality of microfluidic cooling channels 175. Each microfluidic cooling channel 175 in this third silicon sublayer 245 also has a thickness (diameter or height) generally between 100 microns and 300 microns, or more particularly between 125 microns and 275 microns, or more particularly between 150 microns and 250 microns, or more particularly between 175 microns and 225 microns, or more particularly on the order of about 200 microns in thickness, and may have any selected width generally on the order of between 25 microns to 300 microns, or more particularly between 50 microns and 250 microns, or more particularly between 75 microns and 125 microns, or more particularly between 90 microns and 110 microns, or more particularly on the order of about 100 microns in width, and a length which generally spans the length (or much of the length) of the 3D VLSI data switching apparatus 100. The microfluidic cooling channels 175 are also coupled to a microfluidic pump 265, and as mentioned above, typically a suitable fluid (such as filtered cold water, e.g., filtered tap water) is pumped through the microfluidic cooling channels 175 for heat transfer, with or without any return path for cooling and water reuse of the warmed fluid. Also another alternative, the microfluidic cooling channels 175 may also be coupled to each other at one end of the device to provide a round trip a fluid return path, not separately illustrated, or may have such a return path coupled externally to the pump 265.

Next to or adjacent the third silicon sublayer 245 is a third active silicon sublayer 250 (which has a thickness generally between 2 microns and 8 microns, or more particularly between 3 microns and 7 microns, or more particularly between 4 microns and 6 microns, or more particularly on the order of about 5 microns in thickness), which includes the second plurality of photonic transceivers 115B, and provides a close coupling of the microfluidic cooling channels 175 to the heat-generating second plurality of photonic transceivers 115B, also thereby allowing significantly improved switching and data transmission rates without harming the 3D VLSI data switching apparatus 100. Next to or adjacent the third active silicon sublayer 250 is a third metal sublayer 255 (also which has a thickness generally between 2 microns and 8 microns, or more particularly between 3 microns and 7 microns, or more particularly between 4 microns and 6 microns, or more particularly on the order of about 5 microns in thickness) providing wire interconnections (between and among the transistors, buffers, etc. forming the second plurality of photonic transceivers 115B), external connections (as an option in addition to photonic external connections, such as power, ground, and clocking), and also providing metal though-silicon via (TSV) 180 connections between adjacent VLSI layers (in this case, between second and third VLSI layers 155 and 160 (which then further connect to the first VLSI layer 150), providing connections between the interconnection network 110 and the plurality of photonic transmitters (or photonic transceivers) 115B). Next to or adjacent the third metal sublayer 255 is a third silicon dioxide sublayer 260, also which has a thickness generally between 2 microns and 8 microns, or more particularly between 3 microns and 7 microns, or more particularly between 4 microns and 6 microns, or more particularly on the order of about 5 microns in thickness.

Figure 7:
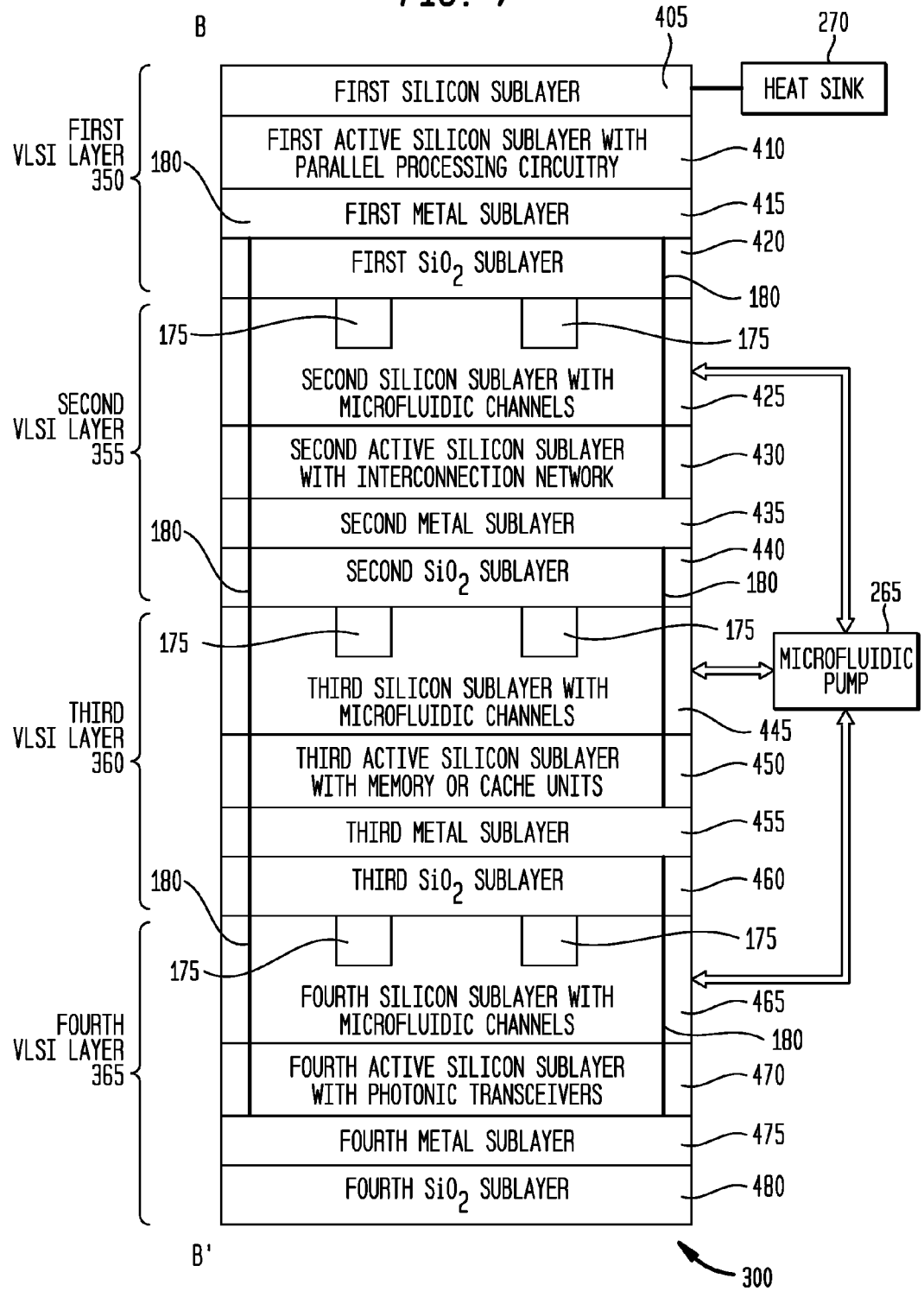
FIG. 7 is a cross sectional view of the parallel processing architecture with an interconnection network with photonic transceivers of FIG. 6 and illustrating of a plurality of VLSI circuit layers with microfluidic cooling in the second exemplary embodiment of a 3D VLSI parallel processing and data switching apparatus.

In another embodiment, one of the first VLSI layer 150 or the third VLSI layer 160 is not included, providing a 3D VLSI data switching apparatus 100 having two rather than three VLSI layers, as several variations. In a first variation, the interconnection network 110 is included in the first active silicon sublayer 210, and both the plurality of photonic receivers (or photonic transceivers) 115A and plurality of photonic transmitters (or photonic transceivers) 115B are included in the second active silicon sublayer 230, without a third VLSI layer 160. This variation is also illustrated in FIG. 7 with respect to the 3D VLSI parallel processing and data switching apparatus 300. In a second variation, both the pluralities of photonic receivers and transmitters 115A, 115B are included in the first active silicon sublayer 210, and the interconnection network 110 is included in the second active silicon sublayer 230, also without a third VLSI layer 160. In a third variation, the interconnection network 110 is included in the second active silicon sublayer 230, and both the pluralities of photonic receivers and transmitters 115A, 115B are included in the third active silicon sublayer 250, and also without a first VLSI layer 150. For this latter embodiment, there may be an additional thickness to or a second layer added to the upper silicon sublayer (225) to accommodate microfluidic cooling channels 175 providing cooling to this upper VLSI layer in addition to the lower VLSI layer.

It should be noted that while described and illustrated in a particular order, those having skill in the art will recognize that the plurality of different VLSI layers may be arranged and ordered in a plurality of equivalent ways. For example, the plurality of different VLSI layers illustrated and described with reference to FIGS. 2 and 7 may be inverted or reversed, top to bottom or bottom to top, without affecting the functionality or cooling of the 3D VLSI data switching apparatus 100 or 3D VLSI data switching and parallel processing apparatus 300. The choice for ordering the various different VLSI layers is largely based on a determination of which VLSI layers may be cooled via the heat sink 270 and which would benefit most from microfluidic cooling.

It should also be noted that each microfluidic cooling channel 175 is generally spaced apart from the other microfluidic cooling channels 175 in the corresponding silicon sublayer of the various VLSI layers (150, 155, 160, and 350, 355, 360, 365 discussed below). Such spacing between adjacent microfluidic cooling channels 175 is generally on the order of between 25 microns to 300 microns, or more particularly between 50 microns and 250 microns, or more particularly between 75 microns and 125 microns, or more particularly between 90 microns and 110 microns, or more particularly on the order of about 100 microns between adjacent microfluidic cooling channels 175.

One important feature not illustrated in FIGS. 1 and 2 is the idea of using material which provides excellent thermal conductivity, such as polycrystalline diamond (instead of silicon) for the substrate providing microfluidic cooling around the photonic device (of a transceiver in the bottom sublayer). Such material would spread the heat generated by the 3D VLSI data switching apparatus 100 over a certain volume; this will allow more effective removal of this heat using microfluidic cooling that can be implemented using single-phase or two-phase cooling. Such a feature would also be relevant for the 3D VLSI data switching apparatus 300, discussed in greater detail below.

Also, switches comprising a single chip are not a fundamental limitation: once built, a multi-chip switch can be implemented using several such single chips.

The bandwidth and data movement rates of the 3D VLSI data switching apparatus 100 are substantial. For example, using 20 mm width by 20 mm length of the VLSI layers 150, 155, 160, providing for 400 square mm of area available for circuitry and using a 22 nm VLSI technology, allows for over 100,000 to 160,000 photonic transceivers 115, i.e., 100,000 to 160,000 photonic receivers 115A and 100,000 to 160,000 photonic transmitters 115B, with each photonic transceivers 115 (or combined receiver and transmitter) generally requiring at most about 50 microns by 50 microns of area in the VLSI layer. Stated another way, the three-dimensional VLSI integrated circuit apparatus comprises at least 100,000 photonic receivers and at least 100,000 photonic transmitters per 400 square millimeters of area, and as feature sizes decrease, the number of transceivers 115 per unit area will scale and increase proportionally. At a data transmission and reception rate of 25 G bps (Gigabits per second) per transmitter and receiver 115B, 115A, with power at one pJ/bit, this allows for the 3D VLSI data switching apparatus 100 to have a significantly high data transmission and reception rate of 2.5 T bps to 4 T bps, orders of magnitude higher than what is currently available.

Figure 6:
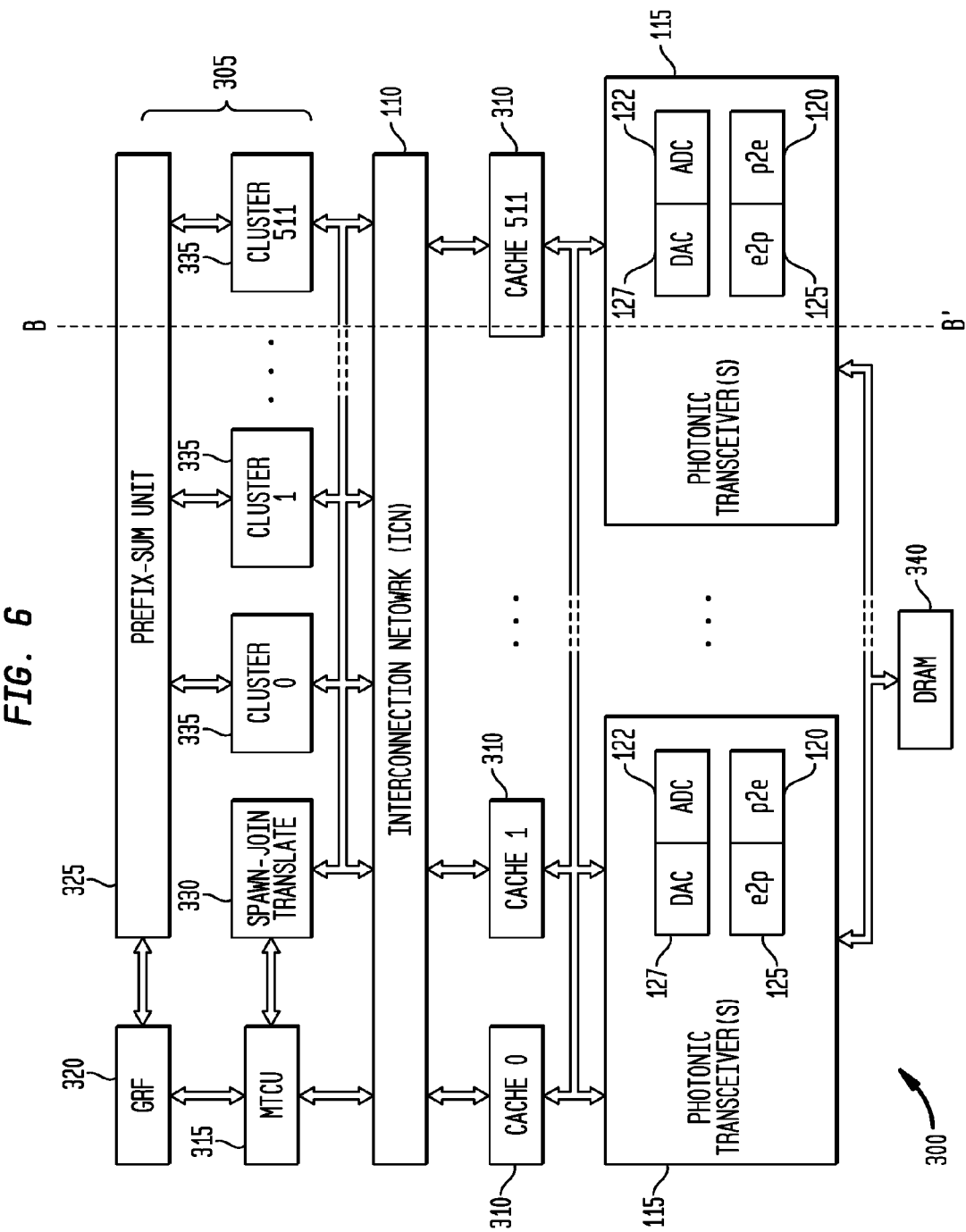
FIG. 6 is a block diagram of a parallel processing architecture with an interconnection network with photonic transceivers of a second exemplary embodiment of a 3D VLSI data switching and parallel processing apparatus having microfluidic cooling.

FIG. 6 is a block diagram of a parallel processing architecture with an interconnection network with photonic transceivers of a second exemplary embodiment of a 3D VLSI data switching and parallel processing apparatus 300 having microfluidic cooling. FIG. 7 is a cross sectional view (through the B-B' plane of FIG. 6) of the parallel processing architecture with an interconnection network with photonic transceivers of FIG. 6 and illustrating of a plurality of VLSI circuit layers with microfluidic cooling in the second exemplary embodiment of a 3D VLSI parallel processing and data switching apparatus 300.

Referring to FIGS. 6 and 7, the exemplary 3D VLSI parallel processing and data switching apparatus 300 comprises a parallel processing architecture 305 (described in greater detail below), an interconnection network 110, memory comprising a plurality of caches 310 (typically shared L1 caches), with a plurality of photonic transceivers 115 for data input and for data output (which may be combined as illustrated or separated equivalently into a plurality of photonic receivers 115A and a plurality of photonic transmitters 115B as discussed above). Coupled between the caches 310 and the plurality of photonic transceivers 115 are a plurality of bidirectional or combined photonic-electronic converters 120, 125, providing p2e and e2p communications and analog-digital conversions as discussed above, for example and without limitation.

The illustrated parallel processing architecture 305 of FIG. 6 is provided as an example of a parallel processing architecture which may be included in a 3D VLSI parallel processing and data switching apparatus 300, and should not be regarded as limiting. This parallel processing architecture 305 and other parallel processing architecture have been described in detail in: U.S. Pat. No. 6,463,527, titled "Spawn-Join Instruction Set Architecture for Providing Explicit Multithreading", issued Oct. 8, 2002: U.S. Pat. No. 7,523,293, titled "Spawn-Join Instruction Set Architecture for Providing Explicit Multithreading", issued Apr. 21, 2009; U.S. Pat. No. 7,707,288, titled "Computer Memory Architecture for Hybrid Serial and Parallel Computing Systems", issued Apr. 27, 2010; and U.S. Pat. No. 8,145,879, titled "Computer Memory Architecture for Hybrid Serial and Parallel Computing Systems", issued Mar. 27, 2012; all issued to the inventor herein, and all hereby incorporated by reference herein with the same full force and effect as if set forth in its entireties herein.

The MTCU 315 is a master thread control unit and may be implemented using a processor core, such as an unmodified high-end ARM core (e.g., Cortex-A15). The GRF 320 is a global register file. The prefix-sum unit 325 performs prefix-sum calculations utilized in thread and instruction management. The spawn-join unit 330 provides for thread management. Global registers 320, prefix-sum unit 325, and spawn-join unit 330 are standalone coprocessors. A plurality of clusters 335 (illustrated as 512 clusters) perform various calculations and may also include thread control. Memory modules (also 512 of them) are illustrated as caches 310.

FIG. 6 depicts an embodiment of the explicit multi-threaded (XMT) architecture through integration of 3D-VLSI, microfluidic cooling and photonics. A configuration of 16K thread-control units (TCUs) in 512 clusters 335 each comprising 32 TCUs and 512 memory modules (caches 310) are shown. The separation of the spawn-join unit 330 from the master thread control unit (MTCU 315) allows using off-the-shelf (ARM) processors for the MTCU and TCUs. Each transceiver 115 block provides conversions between electronics and photonics: e2p and p2e. Most on-chip data movement (DM) occurs in the interconnection network (also referred to herein as an "ICN") 110. In this particular embodiment DM is basically in a separate sublayer, and therefore the on-chip DM problem is handled by cooling the ICN 110 sublayer. Cooling off-chip porting of DM is handled by cooling the transceiver 115 sublayer, and once in the optics regime, DM dissipates little power. Each memory/DRAM unit 340 can be a separate chip (a corresponding transceiver 115 on the memory/DRAM side is not separately illustrated in FIG. 6), which allows significant scaling of memory size. Other embodiments may follow a less clear separation into layers and sublayers, for example mixing and combinations of ICN elements, processing elements (such as TCUs), cache element or conversion/transceiver units in the same layer or sublayer.

Referring to FIG. 7, the representative or exemplary 3D VLSI parallel processing and data switching apparatus 300 also comprises a plurality of different VLSI layers, namely, a first VLSI layer 350, a second VLSI layer 355, a third VLSI layer 360, and a fourth VLSI layer 356, each of which comprises a plurality of VLSI sublayers in a selected order to provide for both though-silicon via (TSV) 180 metal interconnections (not separately illustrated) between the plurality of VLSI layers 350, 355, 360 and 365, but also microfluidic cooling through microfluidic cooling channels 175 between the plurality of VLSI layers 350, 355, 360 and 365 and in comparatively close proximity to the active silicon sublayers 430, 450, 470, and optionally 410. As mentioned above, each of these sublayers generally has a width and length (x-axis and y-axis) which are coextensive with the entire width and length of the VLSI layers and the 3D VLSI parallel processing and data switching apparatus 300, and have varying thicknesses (z-axis), as described below.

The first VLSI layer 350 includes a first silicon sublayer 405 which has a thickness generally between 500 microns and 1500 microns, or more particularly between 700 microns and 1300 microns, or more particularly between 900 microns and 1100 microns, or more particularly between 950 microns and 1050 microns, or more particularly on the order of about 995 microns in thickness. The first silicon sublayer 405 is typically coupled to a heat sink 270 for cooling as illustrated, but which may also include microfluidic cooling channels 175 (not separately illustrated). Next to or adjacent the first silicon sublayer 405 is a first active silicon sublayer 410 (also which has a thickness generally between 2 microns and 8 microns, or more particularly between 3 microns and 7 microns, or more particularly between 4 microns and 6 microns, or more particularly on the order of about 5 microns in thickness), which includes the parallel processing architecture 305. The first active silicon sublayer 410 having the parallel processing architecture 305 is typically cooled through the first silicon sublayer 405 coupled to the heat sink 270 (or having microfluidic cooling channels 175, as described below).

Next to or adjacent the first active silicon sublayer 410 is a first metal sublayer 415 (also which has a thickness generally between 2 microns and 8 microns, or more particularly between 3 microns and 7 microns, or more particularly between 4 microns and 6 microns, or more particularly on the order of about 5 microns in thickness), providing wire interconnections (between and among the transistors, buffers, etc. forming the parallel processing architecture 305), and also providing metal though-silicon via (TSV) 180 connections between adjacent VLSI layers as described above (in this case, between first and second VLSI layers 350 and 355). Next to or adjacent the first metal sublayer 415 is a first silicon dioxide sublayer 420, also which has a thickness generally between 2 microns and 8 microns, or more particularly between 3 microns and 7 microns, or more particularly between 4 microns and 6 microns, or more particularly on the order of about 5 microns in thickness.

The second VLSI layer 355 is coupled to the first silicon dioxide sublayer 420 of the first VLSI layer 350. The second VLSI layer 355 includes a second silicon sublayer 425 which includes a plurality of microfluidic cooling channels 175. The second silicon sublayer 425 has a thickness sufficient to provide for the diameter (or height and width) of the microfluidic cooling channels 175; the thickness of the second silicon sublayer 425 is generally between 150 microns and 350 microns, or more particularly between 200 microns and 300 microns, or more particularly between 225 microns and 275 microns, or more particularly on the order of about 255 microns in thickness, which second silicon sublayer 425 in turn includes a plurality of microfluidic cooling channels 175. Each microfluidic cooling channel 175 has a thickness (diameter or height) generally between 100 microns and 300 microns, or more particularly between 125 microns and 275 microns, or more particularly between 150 microns and 250 microns, or more particularly between 175 microns and 225 microns, or more particularly on the order of about 200 microns in thickness, and may have any selected width generally on the order of between 25 microns to 300 microns, or more particularly between 50 microns and 250 microns, or more particularly between 75 microns and 125 microns, or more particularly between 90 microns and 110 microns, or more particularly on the order of about 100 microns in width, and a length which generally spans the length (or much of the length) of the 3D VLSI parallel processing and data switching apparatus 300. The microfluidic cooling channels 175 are coupled to a microfluidic pump 265, and as mentioned above, typically a suitable fluid (such as filtered cold water, e.g., filtered tap water) is pumped through the microfluidic cooling channels 175 for heat transfer, with or without any return path for cooling and water reuse of the warmed fluid. Also another alternative, the microfluidic cooling channels 175 may also be coupled to each other at one end of the device to provide a round trip a fluid return path, not separately illustrated, or may have such a return path coupled externally to the pump 265.

Next to or adjacent the second silicon sublayer 425 is a second active silicon sublayer 430 (also which has a thickness generally between 2 microns and 8 microns, or more particularly between 3 microns and 7 microns, or more particularly between 4 microns and 6 microns, or more particularly on the order of about 5 microns in thickness), which includes the interconnection network 110, and provides a close coupling of the microfluidic cooling channels 175 to the heat-generating interconnection network 110, thereby allowing significantly improved switching and data transmission rates without harming the 3D VLSI parallel processing and data switching apparatus 300. Next to or adjacent the second active silicon sublayer 430 is a second metal sublayer 435 (also which has a thickness generally between 2 microns and 8 microns, or more particularly between 3 microns and 7 microns, or more particularly between 4 microns and 6 microns, or more particularly on the order of about 5 microns in thickness), providing wire interconnections (between and among the transistors, buffers, etc. forming the interconnection network 110) and also providing metal though-silicon via (TSV) 180 connections between adjacent VLSI layers as described above (in this case, between first, second and third VLSI layers 350, 355 and 360). Next to or adjacent the second metal sublayer 435 is a second silicon dioxide sublayer 440 (also which has a thickness generally between 2 microns and 8 microns, or more particularly between 3 microns and 7 microns, or more particularly between 4 microns and 6 microns, or more particularly on the order of about 5 microns in thickness).

The third VLSI layer 360 is coupled to the second silicon dioxide sublayer 440 of the second VLSI layer 355. The third VLSI layer 360 includes a third silicon sublayer 445, which includes a plurality of microfluidic cooling channels 175. The third silicon sublayer 445 has a thickness sufficient to provide for the diameter (or height and width) of the microfluidic cooling channels 175; the thickness of the third silicon sublayer 445 is generally between 150 microns and 350 microns, or more particularly between 200 microns and 300 microns, or more particularly between 225 microns and 275 microns, or more particularly on the order of about 255 microns in thickness, which third silicon sublayer 445 in turn includes a plurality of microfluidic cooling channels 175. Each microfluidic cooling channel 175 has a thickness (diameter or height) generally between 100 microns and 300 microns, or more particularly between 125 microns and 275 microns, or more particularly between 150 microns and 250 microns, or more particularly between 175 microns and 225 microns, or more particularly on the order of about 200 microns in thickness, and may have any selected width generally on the order of between 25 microns to 300 microns, or more particularly between 50 microns and 250 microns, or more particularly between 75 microns and 125 microns, or more particularly between 90 microns and 110 microns, or more particularly on the order of about 100 microns in width, and a length which generally spans the length (or much of the length) of the 3D VLSI parallel processing and data switching apparatus 300. The microfluidic cooling channels 175 are also coupled to a microfluidic pump 265, and as mentioned above, typically a suitable fluid (such as filtered cold water, e.g., filtered tap water) is pumped through the microfluidic cooling channels 175 for heat transfer, with or without any return path for cooling and water reuse of the warmed fluid. Also another alternative, the microfluidic cooling channels 175 may also be coupled to each other at one end of the device to provide a round trip a fluid return path, not separately illustrated, or may have such a return path coupled externally to the pump 265.

Next to or adjacent the third silicon sublayer 445 is a third active silicon sublayer 450 (also which has a thickness generally between 2 microns and 8 microns, or more particularly between 3 microns and 7 microns, or more particularly between 4 microns and 6 microns, or more particularly on the order of about 5 microns in thickness), which includes the memory circuitry such as cache units 310, and provides a close coupling of the microfluidic cooling channels 175 to the heat-generating memory circuitry such as cache units 310, also thereby allowing significantly improved switching and data transmission rates without harming the 3D VLSI parallel processing and data switching apparatus 300. Next to or adjacent the third active silicon sublayer 450 is a third metal sublayer 455 (also which has a thickness generally between 2 microns and 8 microns, or more particularly between 3 microns and 7 microns, or more particularly between 4 microns and 6 microns, or more particularly on the order of about 5 microns in thickness), providing wire interconnections (between and among the transistors, buffers, etc. forming the memory circuitry such as cache units 310), and also providing metal though-silicon via (TSV) 180 connections between adjacent VLSI layers as described above (in this case, between second, third and fourth VLSI layers 355, 360 and 365). Next to or adjacent the third metal sublayer 455 is a third silicon dioxide sublayer 460 (also which has a thickness generally between 2 microns and 8 microns, or more particularly between 3 microns and 7 microns, or more particularly between 4 microns and 6 microns, or more particularly on the order of about 5 microns in thickness).

Not separately illustrated, it should be noted that the third VLSI layer 360 may be repeated, adding one or more additional third VLSI layers 360 between the second VLSI layer 355 and fourth VLSI layer 365, or between any of the other VLSI layers. In doing so, not only is a hybrid memory cube formed, but a 3D VLSI SoC (system on a chip) memory cube having both a significant interconnection network 110 and a significant parallel processing architecture 305, without requiring off-chip memory storage, data routing, and data processing.

The fourth VLSI layer 365 is coupled to the third silicon dioxide sublayer 460 of the third VLSI layer 360 (or any intervening, repeated third VLSI layer 360). The fourth VLSI layer 365 includes a fourth silicon sublayer 465 which includes a plurality of microfluidic cooling channels 175. The fourth silicon sublayer 465 has a thickness sufficient to provide for the diameter (or height and width) of the microfluidic cooling channels 175; the thickness of the fourth silicon sublayer 465 is generally between 150 microns and 350 microns, or more particularly between 200 microns and 300 microns, or more particularly between 225 microns and 275 microns, or more particularly on the order of about 255 microns in thickness, which fourth silicon sublayer 465 in turn includes a plurality of microfluidic cooling channels 175. Each microfluidic cooling channel 175 has a thickness (diameter or height) generally between 100 microns and 300 microns, or more particularly between 125 microns and 275 microns, or more particularly between 150 microns and 250 microns, or more particularly between 175 microns and 225 microns, or more particularly on the order of about 200 microns in thickness, and may have any selected width generally on the order of between 25 microns to 300 microns, or more particularly between 50 microns and 250 microns, or more particularly between 75 microns and 125 microns, or more particularly between 90 microns and 110 microns, or more particularly on the order of about 100 microns in width, and a length which generally spans the length (or much of the length) of the 3D VLSI parallel processing and data switching apparatus 300. The microfluidic cooling channels 175 are also coupled to a microfluidic pump 265, and as mentioned above, typically a suitable fluid (such as filtered cold water, e.g., filtered tap water) is pumped through the microfluidic cooling channels 175 for heat transfer, with or without any return path for cooling and water reuse of the warmed fluid. Also another alternative, the microfluidic cooling channels 175 may also be coupled to each other at one end of the device to provide a round trip a fluid return path, not separately illustrated, or may have such a return path coupled externally to the pump 265.

Next to or adjacent the fourth silicon sublayer 465 is a fourth active silicon sublayer 470 (also which has a thickness generally between 2 microns and 8 microns, or more particularly between 3 microns and 7 microns, or more particularly between 4 microns and 6 microns, or more particularly on the order of about 5 microns in thickness), which includes the plurality of photonic transceivers 115, and provides a close coupling of the microfluidic cooling channels 175 to the heat-generating plurality of photonic transceivers 115, also thereby allowing significantly improved switching and data transmission rates without harming the 3D VLSI parallel processing and data switching apparatus 300. Next to or adjacent the fourth active silicon sublayer 470 is a fourth metal sublayer 475 (also which has a thickness generally between 2 microns and 8 microns, or more particularly between 3 microns and 7 microns, or more particularly between 4 microns and 6 microns, or more particularly on the order of about 5 microns in thickness) providing wire interconnections (between and among the transistors, buffers, etc. forming the plurality of photonic transceivers), external connections (as an option in addition to photonic external connections, such as power, ground, and clocking), and also providing metal though-silicon via (TSV) 180 connections between adjacent VLSI layers as described above (in this case, between third and fourth VLSI layers 360 and 365). Next to or adjacent the fourth metal sublayer 475 is a fourth silicon dioxide sublayer 480 (also which has a thickness generally between 2 microns and 8 microns, or more particularly between 3 microns and 7 microns, or more particularly between 4 microns and 6 microns, or more particularly on the order of about 5 microns in thickness).

As mentioned above, those having skill in the art will recognize that the plurality of different VLSI layers may be arranged and ordered in a plurality of equivalent ways. For example, the plurality of different VLSI layers illustrated and described with reference to FIGS. 2 and 7 may be inverted or reversed, top to bottom or bottom to top. Continuing with the example for the 3D VLSI data switching and parallel processing apparatus 300, it may be arranged bottom to top, with the fourth VLSI layer having the optical transceivers becoming the top layer cooled by the heat sink 270, then coupled to the third VLSI layer having the memory circuits and microfluidic cooling, which in turn is then coupled to the second VLSI layer having the interconnection network and microfluidic cooling, and lastly coupled to the first VLSI layer having the parallel processing circuits and also microfluidic cooling.

In summary, the above demonstrated a framework for overcoming: (1) on-chip DM by cooling a sublayer in which most DM occurs in one preferred embodiment; and (2) off-chip DM by cooling both the conversion to photonics and the transceiver transmitting the optical signal to an external memory/DRAM unit or a plurality of units, as well as the way back, receiving the photonic signal from such unit, or units, and converting to an electronic signal. Current conversions between photonics and electronics and transmissions in photonics already are already quite efficient in terms of pJ/bit even when limited to being silicon-compatible. Improvements that can reduce this energy consumption by orders of magnitude (e.g., perhaps even to single digit fJ/bit) is actively worked on. The "footprint" of such transmission and conversions is also low enough to allow drastic scaling in chip designs using them in large numbers. These same cooling approaches apply to other design alternatives, including different composition of chips, as noted above. The invention comprises alternatives such as separating the above design to a greater number of chips or to fewer chips. For example, putting the interconnection network (ICN) on one chip or a plurality of chips, placing the components of parallel processing architecture 305 either on the same chip or on one or a plurality of other chips, placing caches on the ICN chip or on one or a plurality of other chips, or combining caches with memory/DRAM chips, or place them on one or a plurality of separate chips. Some or all of the interconnects also can be supported by photonic links along with proper conversion units, as needed.

Removing DM as a feasibility bottleneck would turn common wisdom on scaling limitations on its head. It will also bring back a Moore's-Law-type framework. Moore's Law relied on the "software spiral": Processor vendors aimed their next generation for faster support of the same software base. Microfluidic hotspot cooling avails high-performing hardware prototyping of next generation photonics; this enables developing applications prior to making the next round of high investment in both the advancement of improved (i.e., lower power) photonics and its commodity production. Facilitating this DM revolution and a Moore's Law type framework are both integral parts of this invention.

The overall effect, especially if an embodiment comprising a high number of chips is pursued, could be extra scaling memory size by greater than 100×, extra speed by greater than 10×, ease-of-programming by an order of magnitude, and speedup on applications requiring high-communication bandwidth that could not fit within prior XMT memory by greater than 100×. Prior hardware and software prototyping of the XMT framework demonstrated efficient implementation of the leading theory of parallel algorithms, and 10-100× speedups on "irregular" applications.

Although the invention has been described with respect to specific embodiments thereof, these embodiments are merely illustrative and not restrictive of the invention. In the description herein, numerous specific details are provided, such as examples of electronic components, electronic and structural connections, materials, and structural variations, to provide a thorough understanding of embodiments of the present invention. One skilled in the relevant art will recognize, however, that an embodiment of the invention can be practiced without one or more of the specific details, or with other apparatus, systems, assemblies, components, materials, parts, etc. In other instances, well-known structures, materials, or operations are not specifically shown or described in detail to avoid obscuring aspects of embodiments of the present invention. One having skill in the art will further recognize that additional or equivalent method steps may be utilized, or may be combined with other steps, or may be performed in different orders, any and all of which are within the scope of the claimed invention. In addition, the various Figures are not drawn to scale and should not be regarded as limiting.

Reference throughout this specification to "one embodiment", "an embodiment", or a specific "embodiment" means that a particular feature, structure, or characteristic described in connection with the embodiment is included in at least one embodiment and not necessarily in all embodiments, and further, are not necessarily referring to the same embodiment. Furthermore, the particular features, structures, or characteristics of any specific embodiment may be combined in any suitable manner and in any suitable combination with one or more other embodiments, including the use of selected features without corresponding use of other features. In addition, many modifications may be made to adapt a particular application, situation or material to the essential scope and spirit of the present invention. It is to be understood that other variations and modifications of the embodiments of the present invention described and illustrated herein are possible in light of the teachings herein and are to be considered part of the spirit and scope of the present invention.

It will also be appreciated that one or more of the elements depicted in the Figures can also be implemented in a more separate or integrated manner, or even removed or rendered inoperable in certain cases, as may be useful in accordance with a particular application. Integrally formed combinations of components are also within the scope of the invention, particularly for embodiments in which a separation or combination of discrete components is unclear or indiscernible. In addition, use of the term "coupled" herein, including in its various forms such as "coupling" or "couplable", means and includes any direct or indirect structural coupling, connection or attachment, or adaptation or capability for such a direct or indirect structural coupling, connection or attachment, including integrally formed components and components which are coupled via or through another component.

A CPU or "processor" may be any type of processor, and may be embodied as one or more processors, configured, designed, programmed or otherwise adapted to perform the functionality discussed herein. As the term processor is used herein, a processor may include use of a single integrated circuit ("IC"), or may include use of a plurality of integrated circuits or other components connected, arranged or grouped together, such as controllers, microprocessors, digital signal processors ("DSPs"), parallel processors, multiple core processors, custom ICs, application specific integrated circuits ("ASICs"), field programmable gate arrays ("FPGAs"), adaptive computing ICs, associated memory (such as RAM, DRAM and ROM), and other ICs and components, whether analog or digital. As a consequence, as used herein, the term processor should be understood to equivalently mean and include a single IC, or arrangement of custom ICs, ASICs, processors, microprocessors, controllers, FPGAs, adaptive computing ICs, or some other grouping of integrated circuits which perform the functions discussed below, with associated memory, such as microprocessor memory or additional RAM, DRAM, SDRAM, SRAM, MRAM, ROM, FLASH, EPROM, E²PROM, or other forms of solid state memory. A processor (such as processor within a cluster 335), with its associated memory, may be adapted or configured (via programming, FPGA interconnection, or hard-wiring) to perform any methodology. For example, the methodology may be programmed and stored, in a processor with its associated memory (and/or external memory) and other equivalent components, as a set of program instructions or other code (or equivalent configuration or other program) for subsequent execution when the processor is operative (i.e., powered on and functioning). Equivalently, when the processor may implemented in whole or part as FPGAs, custom ICs and/or ASICs, the FPGAs, custom ICs or ASICs also may be designed, configured and/or hard-wired to implement a methodology. For example, the processor may be implemented as an arrangement of analog and/or digital circuits, controllers, microprocessors, DSPs and/or ASICs, collectively referred to as a "processor", which are respectively hard-wired, programmed, designed, adapted or configured to implement a methodology, including possibly in conjunction with a memory.

A memory, such as a cache 310, which may include a data repository (or database), may be embodied in any number of forms, including within any computer or other machine-readable data storage medium, memory device or other storage or communication device for storage or communication of information, currently known or which becomes available in the future, including, but not limited to, a memory integrated circuit ("IC"), or memory portion of an integrated circuit (such as the resident memory within a processor), whether volatile or non-volatile, whether removable or non-removable, including without limitation RAM, FLASH, DRAM, SDRAM, SRAM, MRAM, FeRAM, ROM, EPROM, E²PROM, other forms of solid state memory, or any other form of memory device or other machine-readable storage or memory media, or any other type of memory, storage medium, or data storage apparatus or circuit, which is known or which becomes known, depending upon the selected embodiment.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

It should also be noted that the described feature and layer sizes, thicknesses, and width are generally relative, such as to a 22 nm VLSI technology, and these feature sizes will generally scale with corresponding technologies. For example and without limitation, in another iteration of VLSI technologies, the typical width and height of the microfluidic cooling channels 175 may also shrink, such as to 75 microns in width and 100-150 microns in height.

All documents cited in the Specification or Description are, in relevant part, incorporated herein by reference; the citation of any document is not to be construed as an admission that it is prior art with respect to the present invention. To the extent that any meaning or definition of a term in this document conflicts with any meaning or definition of the same term in a document incorporated by reference, the meaning or definition assigned to that term in this document shall govern.

Furthermore, any signal arrows in the drawings/Figures should be considered only exemplary, and not limiting, unless otherwise specifically noted. Combinations of components of steps will also be considered within the scope of the present invention, particularly where the ability to separate or combine is unclear or foreseeable. The disjunctive term "or", as used herein and throughout the claims that follow, is generally intended to mean "and/or", having both conjunctive and disjunctive meanings (and is not confined to an "exclusive or" meaning), unless otherwise indicated. As used in the description herein and throughout the claims that follow, "a", "an", and "the" shall not be limited to a single item or element and include plural references unless the context clearly dictates otherwise and unless specifically disclaimed. Also as used in the description herein and throughout the claims that follow, the meaning of "in" includes "in" and "on" unless the context clearly dictates otherwise. By way of example, though specific claim language may include the word "between", the interpretation of such a word shall not be limited to preclude extent of elements beyond boundaries of the example unless specific disclaimer is made or unless by virtue of prosecution the term is to be limited. The examples of the invention should therefore not be interpreted as limiting unless indicated as such.

The foregoing description of illustrated embodiments of the present invention, including what is described in the summary or in the abstract, is not intended to be exhaustive or to limit the invention to the precise forms disclosed herein. From the foregoing, it will be observed that numerous variations, modifications and substitutions are intended and may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims. Thus, while there has been set forth embodiments of the invention, the invention is to be limited only by the following claims and equivalents.

What is claimed is:

1. A three-dimensional VLSI integrated circuit apparatus comprising:
    a first VLSI layer comprising:
        a first silicon sublayer coupleable to at least one heat sink;
        a first active silicon sublayer coupled to the first silicon sublayer, the first active silicon sublayer comprising a plurality of photonic receivers; and
        a first metal sublayer coupled to the first active silicon sublayer, the first metal sublayer comprising a first plurality of through-silicon vias;
    a second VLSI layer coupled to the first VLSI layer, the second VLSI layer comprising:
        a second silicon sublayer comprising a first plurality of microfluidic cooling channels;
        a second active silicon sublayer coupled to the second silicon sublayer, the second active silicon sublayer comprising an interconnection network; and
        a second metal sublayer coupled to the second active silicon sublayer, the second metal sublayer comprising a second plurality of through-silicon vias coupling the interconnection network to the plurality of photonic receivers through the first plurality of through-silicon vias; and
    a third VLSI layer coupled to the second VLSI layer, the third VLSI layer comprising:
        a third silicon sublayer comprising a second plurality of microfluidic cooling channels;
        a third active silicon sublayer coupled to the third silicon sublayer, the third active silicon sublayer comprising a plurality of photonic transmitters; and
        a third metal sublayer coupled to the third active silicon sublayer, the third metal sublayer comprising a third plurality of through-silicon vias coupling the plurality of photonic transmitters to the interconnection network.

2. The apparatus of claim 1, wherein the second plurality of through-silicon vias of the second metal sublayer of the second VLSI layer further couple the interconnection network to the plurality of photonic receivers through the first plurality of through-silicon vias and couple the interconnection network to the plurality of photonic transmitters through the third plurality of through-silicon vias.

3. The apparatus of claim 1, wherein the three-dimensional VLSI integrated circuit apparatus comprises at least 100,000 photonic receivers and at least 100,000 photonic transmitters per 400 square millimeters of area.

4. The apparatus of claim 1, wherein each microfluidic cooling channel of the first and second pluralities of microfluidic cooling channels is coupleable to a microfluidic pump and has a width between 75 microns and 125 microns and a height between 100 microns and 300 microns, and wherein the first, second, and third active silicon sublayers each have a thickness between 3 microns and 7 microns; and wherein the first VLSI layer further comprises a first silicon dioxide layer, the second VLSI layer further comprises a second silicon dioxide layer, the third VLSI layer further comprises a third silicon dioxide layer, and the fourth VLSI layer further comprises a fourth silicon dioxide layer, each silicon dioxide layer having a thickness between 3 microns and 7 microns.

5. A three-dimensional VLSI integrated circuit apparatus comprising:
    a first VLSI layer comprising:
        a first silicon sublayer coupleable to at least one heat sink;
        a first active silicon sublayer coupled to the first silicon sublayer, the first active silicon sublayer comprising a first plurality of photonic transceivers; and
        a first metal sublayer coupled to the first active silicon sublayer, the first metal sublayer comprising a first plurality of through-silicon vias; and
    a second VLSI layer coupled to the first VLSI layer, the second VLSI layer comprising:
        a second silicon sublayer comprising a first plurality of microfluidic cooling channels;
        a second active silicon sublayer coupled to the second silicon sublayer, the second active silicon sublayer comprising an interconnection network; and
        a second metal sublayer coupled to the second active silicon sublayer, the second metal sublayer comprising a second plurality of through-silicon vias coupling the interconnection network to one or more photonic transceivers of first plurality of photonic transceivers through the first plurality of through-silicon vias.

6. The apparatus of claim 5, further comprising:
    a third VLSI layer coupled to the second VLSI layer, the third VLSI layer comprising:
        a third silicon sublayer comprising a second plurality of microfluidic cooling channels; and
        a third active silicon sublayer coupled to the third silicon sublayer, the third active silicon sublayer comprising a second plurality of photonic transceivers.

7. The apparatus of claim 6, wherein the third VLSI layer further comprises:
    a third metal sublayer coupled to the third active silicon sublayer, the third metal sublayer comprising a third plurality of through-silicon vias coupling one or more photonic transceivers of the second plurality of photonic transceivers to the interconnection network.

8. The apparatus of claim 7, wherein the second plurality of through-silicon vias of the second metal sublayer of the second VLSI layer further couple the interconnection network to the one or more photonic transceivers of first and second pluralities of photonic transceivers respectively through the first and third pluralities of through-silicon vias.

9. The apparatus of claim 6, wherein the first and second pluralities of microfluidic cooling channels are coupleable to a microfluidic pump.

10. The apparatus of claim 5, further comprising:
    a third VLSI layer coupled between the first and second VLSI layers, the third VLSI layer comprising:
        a third silicon sublayer comprising a second plurality of microfluidic cooling channels; and
        a third active silicon sublayer coupled to the third silicon sublayer, the third active silicon sublayer comprising a plurality of memory circuits; and
        a third metal sublayer coupled to the third active silicon sublayer, the third metal sublayer comprising a third plurality of through-silicon vias coupling the plurality of memory circuits to the interconnection network.

11. The apparatus of claim 10, wherein the plurality of memory circuits further comprise a plurality of shared caches.

12. The apparatus of claim 10, further comprising:
a fourth VLSI layer coupled to the second VLSI layer, the fourth VLSI layer comprising:
a fourth silicon sublayer comprising a third plurality of microfluidic cooling channels;
a fourth active silicon sublayer coupled to the fourth silicon sublayer, the fourth active silicon sublayer comprising a plurality of parallel processing circuits; and
a fourth metal sublayer coupled to the fourth active silicon sublayer, the fourth metal sublayer comprising a fourth plurality of through-silicon vias coupling the plurality of parallel processing circuits to the interconnection network.

13. The apparatus of claim 12, wherein each microfluidic cooling channel of the first, second and third pluralities of microfluidic cooling channels has a width between 75 microns and 125 microns and a height between 100 microns and 300 microns, and wherein the first, second, third and fourth active silicon sublayers each have a thickness between 3 microns and 7 microns.

14. The apparatus of claim 12, wherein the first VLSI layer further comprises a first silicon dioxide layer, the second VLSI layer further comprises a second silicon dioxide layer, the third VLSI layer further comprises a third silicon dioxide layer, and the fourth VLSI layer further comprises a fourth silicon dioxide layer, each silicon dioxide layer having a thickness between 3 microns and 7 microns.

15. The apparatus of claim 12, wherein a plurality of arithmetic logic units of the plurality of parallel processing circuits have a first, combined data processing rate which substantially balances a second, data movement rate of the interconnection network.

16. The apparatus of claim 12, wherein the first, second, third and fourth pluralities of through-silicon vias further provide for data movement between and among the plurality of parallel processing circuits, the interconnection network, the plurality of memory circuits, and the plurality of photonic transceivers.

17. A three-dimensional VLSI integrated circuit apparatus comprising:
a first VLSI layer comprising:
a first silicon sublayer coupleable to at least one heat sink;
a first active silicon sublayer coupled to the first silicon sublayer, the first active silicon sublayer comprising a plurality of parallel processing circuits; and
a first metal sublayer coupled to the first active silicon sublayer, the first metal sublayer comprising a first plurality of through-silicon vias;
a second VLSI layer coupled to the first VLSI layer, the second VLSI layer comprising:
a second silicon sublayer comprising a first plurality of microfluidic cooling channels;
a second active silicon coupled to the second silicon sublayer, the second active silicon sublayer comprising an interconnection network; and
a second metal sublayer coupled to the second active silicon sublayer, the second metal sublayer comprising a second plurality of through-silicon vias coupling the interconnection network to the plurality of parallel processing circuits through the first plurality of through-silicon vias;
a third VLSI layer coupled to the second VLSI layer, the third VLSI layer comprising:
a third silicon sublayer comprising a second plurality of microfluidic cooling channels;
a third active silicon sublayer coupled to the third silicon sublayer, the third active silicon sublayer comprising a plurality of memory circuits; and
a third metal sublayer coupled to the third active silicon sublayer, the third metal sublayer comprising a third plurality of through-silicon vias coupling the plurality of memory circuits to the interconnection network though the second plurality of through-silicon vias; and
a fourth VLSI layer coupled to the third VLSI layer, the fourth VLSI layer comprising:
a fourth silicon sublayer comprising a third plurality of microfluidic cooling channels;
a fourth active silicon sublayer coupled to the fourth silicon sublayer, the fourth active silicon sublayer comprising a plurality of photonic transceivers; and
a fourth metal sublayer coupled to the fourth active silicon sublayer, the fourth metal sublayer comprising a fourth plurality of through-silicon vias coupling the plurality of photonic transceivers to the plurality of memory circuits through the third plurality of through-silicon vias.

18. The apparatus of claim 17, wherein the first, second and third pluralities of microfluidic cooling channels are coupleable to a microfluidic pump, and wherein each microfluidic cooling channel of the first, second and third pluralities of microfluidic cooling channels has a width between 75 microns and 125 microns and a height between 100 microns and 300 microns, and wherein the first, second, third and fourth active silicon sublayers each have a thickness between 3 microns and 7 microns.

19. The apparatus of claim 17, wherein a plurality of arithmetic logic units of the plurality of parallel processing circuits have a first, combined data processing rate which substantially balances a second, data movement rate of the interconnection network, and wherein the first, second, third and fourth pluralities of through-silicon vias further provide for data movement between and among the plurality of parallel processing circuits, the interconnection network, the plurality of memory circuits, and the plurality of photonic transceivers.

20. The apparatus of claim 17, wherein the plurality of memory circuits further comprise a plurality of shared caches; and wherein the plurality of parallel processing circuits further comprise:
at least one processor;
at least one master thread control processor; and
at least one spawn-join coprocessor.

* * * * *